United States Patent

Kobayashi et al.

[11] Patent Number: 6,146,930
[45] Date of Patent: Nov. 14, 2000

[54] METHOD OF FABRICATING AN ACTIVE-MATRIX LIQUID CRYSTAL DISPLAY

[75] Inventors: Kazuhiro Kobayashi; Yuichi Masutani; Hiroyuki Murai, all of Amagasaki, Japan

[73] Assignee: Mitsubishi Denki Kabushiki Kaisha, Tokyo, Japan

[21] Appl. No.: 08/988,001

[22] Filed: Dec. 10, 1997

Related U.S. Application Data

[62] Division of application No. 08/859,338, May 20, 1997, Pat. No. 5,767,930, which is a continuation of application No. 08/359,560, Dec. 20, 1994, abandoned.

[30] Foreign Application Priority Data

May 20, 1994 [JP] Japan .................................. 6-106794

[51] Int. Cl.$^7$ .......................... H01L 21/336; H01L 21/84; H01L 21/8238
[52] U.S. Cl. ............................ 438/154; 438/163
[58] Field of Search ..................... 438/154, 163, 438/302, 30, 217, 289, FOR 169, FOR 184, FOR 201

[56] References Cited

U.S. PATENT DOCUMENTS

| | | | |
|---|---|---|---|
| 4,743,099 | 5/1988 | Noguchi | 359/59 |
| 5,040,875 | 8/1991 | Dickerson et al. | 359/59 |
| 5,042,918 | 8/1991 | Suzuki | 359/59 |
| 5,208,476 | 5/1993 | Inoue | 257/408 |
| 5,317,432 | 5/1994 | Ino | 359/59 |
| 5,323,042 | 6/1994 | Matsumoto | 257/350 |
| 5,329,140 | 7/1994 | Sera | 257/66 |
| 5,412,493 | 5/1995 | Kunii et al. | 359/59 |
| 5,430,320 | 7/1995 | Lee | 257/412 |
| 5,482,870 | 1/1996 | Inoue . | |
| 5,485,019 | 1/1996 | Yamazaki et al. | 257/57 |
| 5,488,005 | 1/1996 | Han et al. . | |
| 5,508,216 | 4/1996 | Inoue | 438/154 |
| 5,563,427 | 10/1996 | Yudasaka et al. | 438/154 |
| 5,753,556 | 5/1998 | Katada et al. | 438/302 |
| 5,770,491 | 6/1998 | Mametani | 438/302 |
| 5,904,511 | 5/1999 | Misawa et al. | 438/154 |

FOREIGN PATENT DOCUMENTS

| | | |
|---|---|---|
| 2-162769 | 6/1990 | Japan . |
| 4-286368 | 10/1992 | Japan . |
| 6-250212 | 9/1994 | Japan . |

OTHER PUBLICATIONS

Wolf, Silicon Processing for the VLSI Era, vol. 2–Process Integration, Sunset Beach: Lattice Press, 1990, pp. 298–311.

*Primary Examiner*—Mary Wilczewski
*Attorney, Agent, or Firm*—Burns, Doane, Swecker & Mathis, LLP

[57] ABSTRACT

An active-matrix liquid crystal display integrally formed with a driver circuit including: a pair of substrates disposed in opposing relation to each other; and a liquid crystal material sandwiched between the pair of substrates, wherein the pair of substrates includes:

a TFT substrate including at least an insulative substrate, source interconnection line and gate interconnection line which are formed in a matrix pattern on the insulative substrate, a thin film transistor provided to each pixel portion for use as a switching element for applying a voltage to a portion of the liquid crystal material which lies at a location where the source interconnection line and the gate interconnection line intersect each other, a pixel electrode connected to a drain electrode of the thin film transistor for supplying a voltage to the liquid crystal material, and a CMOS driver circuit having a CMOS which comprises thin film transistors for supplying an electric signal to the thin film transistor of the pixel portion through the source interconnection line and the gate interconnection line; and a counterpart substrate including an insulative substrate and a counter electrode formed thereon, the thin film transistor provided to the pixel portion being of a first conductivity type and of an offset or LDD structure, at least a first conductivity type thin film transistor of the thin film transistors of the CMOS driver circuit being of an offset or LDD structure.

19 Claims, 16 Drawing Sheets

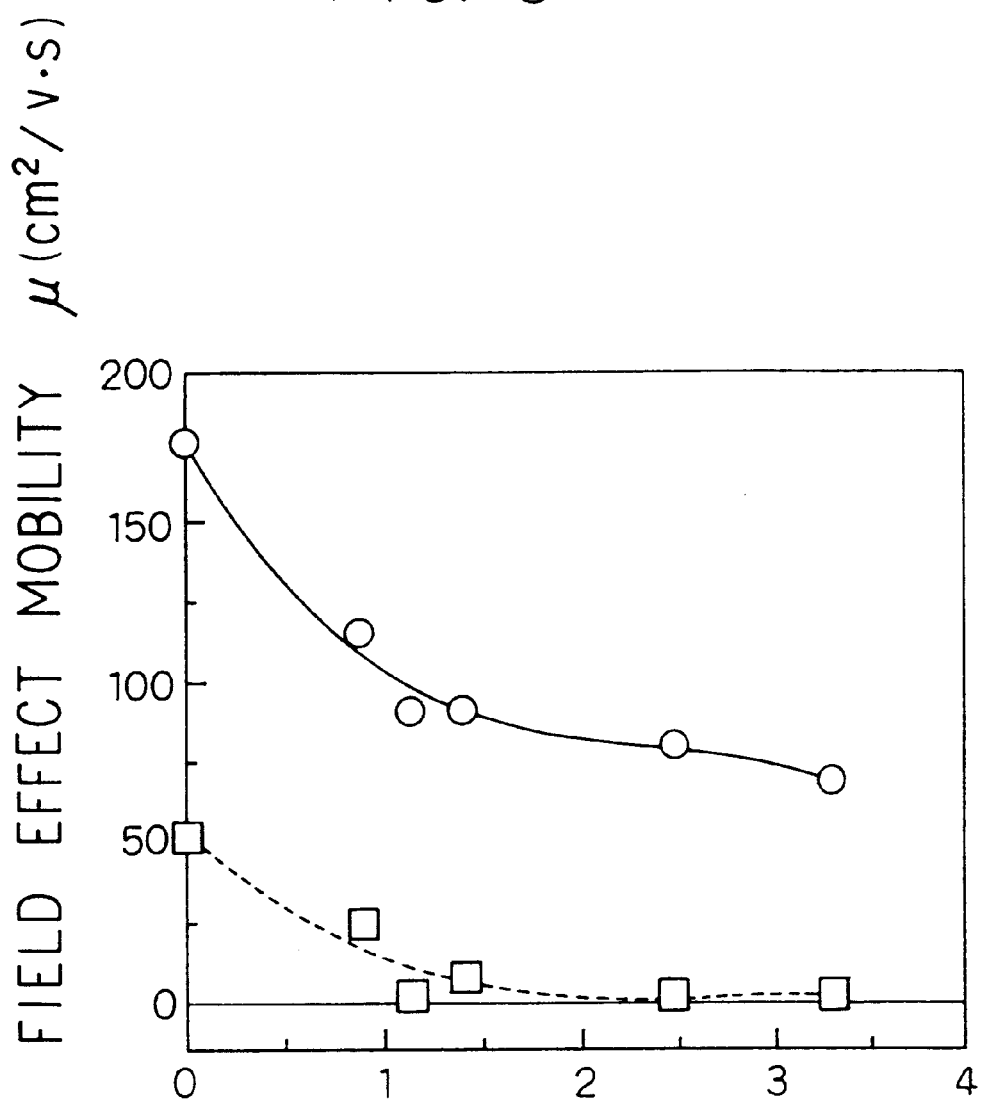

F I G. 11(a)
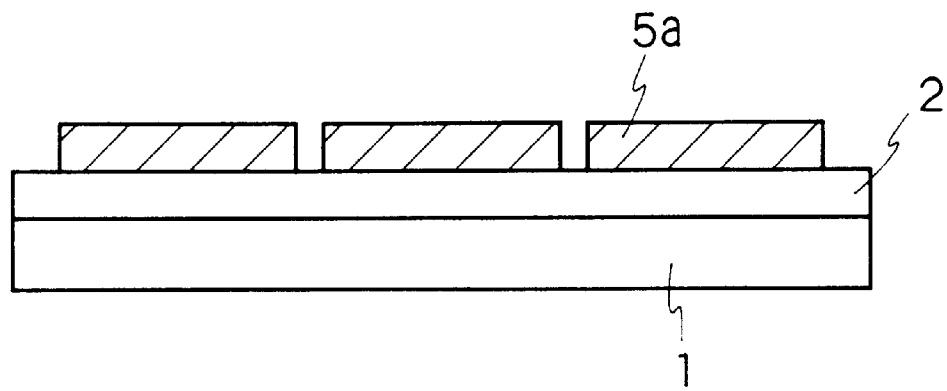
F I G. 11(b)
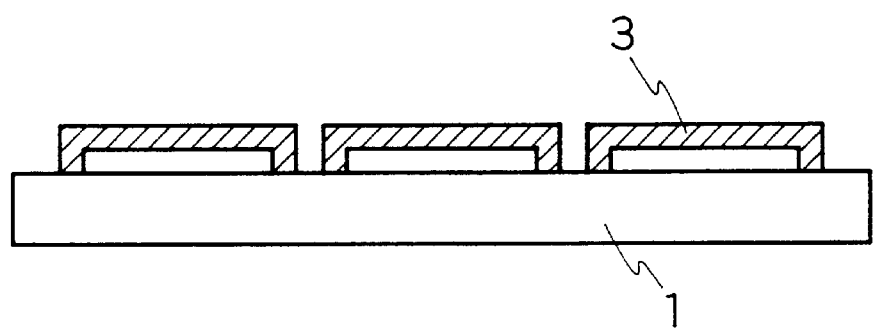
F I G. 11(c)
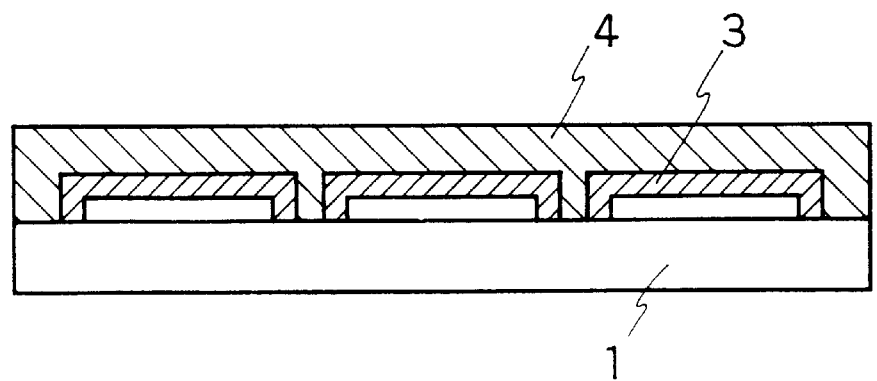

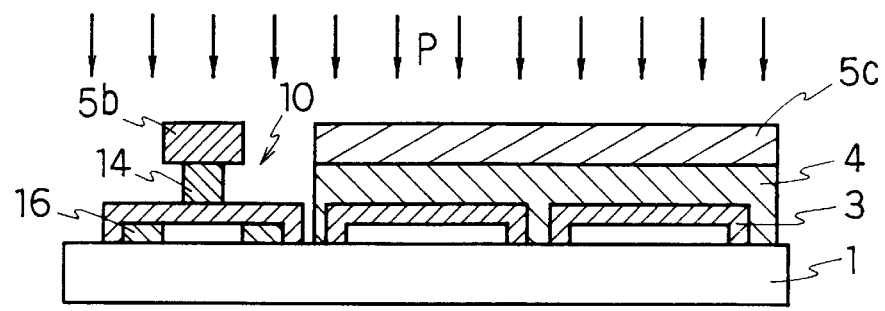
F I G. 11(d)
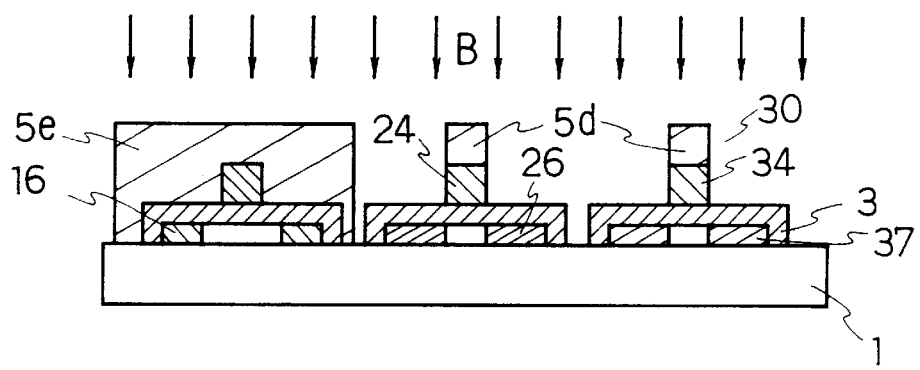
F I G. 11(e)
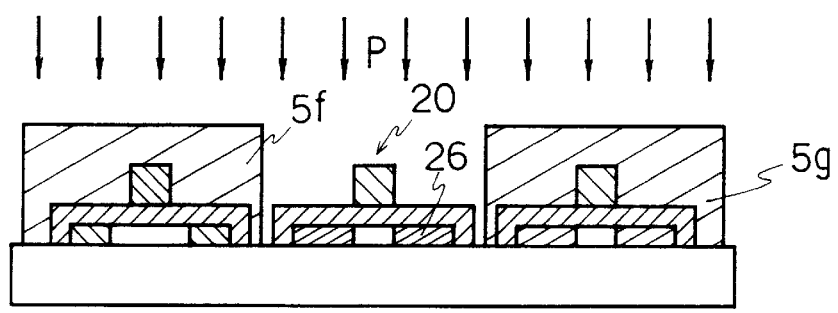
F I G. 11(f)
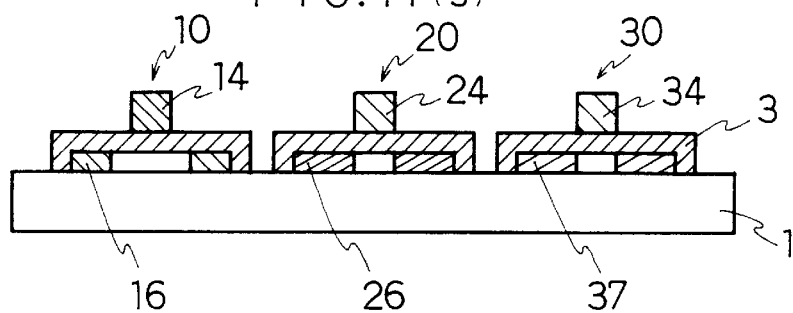
F I G. 11(g)

6,146,930

METHOD OF FABRICATING AN ACTIVE-MATRIX LIQUID CRYSTAL DISPLAY

This application is a divisional of application Ser. No. 08/859,338, filed May 20, 1997 now U.S. Pat. No. 5,767,930; which is a continuation of application Ser. No. 08/359,560, filed Dec. 20, 1994, now abandoned.

BACKGROUND OF THE INVENTION

The present invention relates to an active-matrix liquid crystal display (hereinafter may be referred to as "ANLCD") of the type integrally formed with driver circuitry which employs thin film transistors (hereinafter may be referred to as "TFTs") as pixel switching elements and CMOS driver circuit transistors, and to a fabrication method therefor.

FIGS. 11(a) to 11(g) are sectional views for illustrating a method for fabricating a CMOS driver circuit and a TFT of offset structure as a pixel switching element. This method utilizes a conventional CMOS driver circuit fabrication method as disclosed in, for example, Japanese Unexamined Patent Publication No. 286368/1992 and an offset TFT fabrication method as disclosed in Japanese Unexamined Patent Publication No. 275450/1993. In FIGS. 11(a) to 11(g), numeral 1 denotes an insulative substrate, numeral 2 a polysilicon film for use as a channel semiconductor film, numeral 3 a gate insulating film, numeral 4 an $n^+$-polysilicon containing phosphorus (hereinafter represented as P) at a high concentration and intended for a gate electrode, numerals 5a, 5b, 5c, 5d, 5e, 5f and 5g photoresists, numerals 16 and 26 $n^+$-polysilicon layers implanted with P ion at a high concentration and intended for source/drain regions, and numerals 27 and 37 $p^+$-polysilicon layers implanted with boron (hereinafter represented as B) ion at a high concentration. An n-channel TFT 10 as a pixel switching element herein shown is of offset structure, while n- and p-channel TFTs forming a CMOS driver circuit are not of offset structure but of typical planar structure.

The TFTs of the aforementioned structure are fabricated by the following method. The semiconductor polysilicon film 2 to be used as a channel is formed on the insulative substrate 1, followed by forming the photoresist 5a (refer to FIG. 11(a)) and patterning the polysilicon film 2 to define islands for TFTs. The gate insulating film 3 is then formed by a thermal oxidation process or a same process (refer to FIG. 11(b)).

In turn, the $n^+$-polysilicon film 4 is formed (refer to FIG. 11(c)).

In turn, as shown in FIG. 11(d), a gate electrode pattern of photoresist 5b is formed only on the island intended for TFT 10 for use in a switching element of the pixel portion (that may be hereinafter referred to as the pixel switching TFT). At this time, the islands intended for the CMOS driver TFTs are entirely covered with the photoresist 5c and are not patterned. To make the offset structure, a gate electrode with eaves shown in FIG. 11(d) is formed by overetching of the $n^+$-polysilicon, which is followed by dry-etching of the $n^+$-polysilicon film in the thicknesswise direction thereof by using $SF_6$ gas or the like. Subsequently P is ion-implanted to the resulting substrate surface to form the $n^+$-polysilicon 16 heavily doped with P. In this case, the portion below the eaves of photoresist is not ion-implanted and, hence, the offset structure is realized.

After the photoresists 5b, 5c have been exfoliated, the photoresist 5d is formed for the formation of gate electrodes of the CMOS driver circuit, and then the $n^+$-polysilicon film is etched to form the gate electrodes 24, 34, as shown in FIG. 11(e). At this time, the pixel switching TFT 10 of offset structure is covered with the photoresist 5e. After the formation of the gate electrodes, B-ion implantation is carried out to form source/drain regions 27, 37 of $p^+$-polysilicon heavily doped with B. Thus, p-type TFT 30 is realized.

In turn, as shown in FIG. 11(f), after the pixel switching TFT 10 of offset structure and the p-type TFT 30 of the CMOS driver circuit are covered with photoresists 5f and 5g, respectively, P-ion implantation is carried out to a high concentration to form source/drain regions 26 of $n^+$-polysilicon. Thus, n-type TFT 20 of the CMOS driver circuit is fabricated.

The photoresists 5f, 5g are then exfoliated to realize the basic structure comprising the polysilicon TFT of offset structure to be used as the pixel switching element and the CMOS driver circuit, followed by the formation of source/drain electrodes.

Reference is then made to the operation of the thus formed structure. As described above, the polysilicon TFT of offset structure is used as the pixel switching element. A decrease in "OFF current" is of importance for the pixel switching element. Typically, it is desirable to decrease the "OFF current" to about $10^{-11}$ A or below. However, crystal defects present at the grain boundary influence the polysilicon TFT in the "OFF state" to make field emission current to flow in the drain region thereof, thereby increasing the "OFF current". Accordingly, it is difficult to decrease the "OFF current" to the aforementioned value. For this reason, offset regions are provided on opposite sides of the gate electrode as shown in FIGS. 11(d) to 11(g) so as to decrease the electric field of the drain region thereby to decrease the OFF current.

On the other hand, the CMOS driver circuit region allows an "OFF current" of up to about $10^{-9}$ A. Nevertheless, to realize a high speed operation, a high field effect mobility (i.e., high "ON current") is required. Since an offset region of a TFT serves as series resistance when the TFT is in the "ON state", the field effect mobility is lowered thereby. Therefore, the CMOS circuit employs polysilicon TFTs of the conventional planar type, not of the offset structure.

In constructing the basic TFT structure shown in FIGS. 11(d) to 11(g) comprising the pixel switching TFT of offset structure and the CMOS driver circuit according to the conventional method, the photolithographic process is required to be carried out at least three times and the dry etching process at least three times. This results in a lengthy production process. Further, since the CMOS driver circuit comprises the conventional planar TFTs, higher power source voltage causes a higher electric field to be applied to the drain region of TFT and, hence, a problem of extremely increased drain current will result. For this reason, the power source voltage to be applied to the CMOS transistors is restricted to at most 20 V. This also restricts the gate voltage and source voltage of the pixel switching TFT in driving the liquid crystal.

The present invention has been attained to overcome the foregoing problems. It is, therefore, an object of the present invention to provide an active-matrix liquid crystal display integrally formed with a driver circuit which includes TFTs fabricated on one of a pair of substrates in a shortened process and a CMOS driver circuit adaptable for a high power voltage.

Another object of the present invention is to provide a method for fabricating such an active-matrix liquid crystal display.

SUMMARY OF THE INVENTION

According to one aspect of the present invention, there is provided an active-matrix liquid crystal display integrally formed with a driver circuit comprising:

a pair of substrates disposed in opposing relation to each other; and a liquid crystal material sandwiched between the pair of substrates;

wherein the pair of substrates comprises:

a TFT substrate including at least an insulative substrate, source interconnection line and gate interconnection line which are formed in a matrix pattern on the insulative substrate, a thin film transistor provided to a pixel portion for use as a switching element for applying a voltage to a portion of the liquid crystal material which lies at a location where the source interconnection line and the gate interconnection line intersect each other, a pixel electrode connected to a drain electrode of the thin film transistor for supplying a voltage to the liquid crystal material, and a CMOS driver circuit having a CMOS which comprises thin film transistors for supplying an electric signal to the thin film transistor of the pixel portion through the source interconnection line and the gate interconnection line; and a counterpart substrate including an insulating substrate and a counter electrode formed thereon, the thin film transistor provided to the pixel portion being of a first conductivity type and of an offset or LDD structure, at least a first conductivity type thin film transistor of the thin film transistors of the CMOS driver circuit being of an offset or LDD structure.

The first conductivity type herein is meant by either n-type or p-type, and the second conductivity type is opposite to the first conductivity type. For example, if the first conductivity type is n-type, then the second conductivity type is p-type, and vice versa.

Further, the first conductivity type thin film transistor herein is meant by a first conductivity type channel transistor having source/drain regions of the first conductivity type, and the second conductivity type thin film transistor is the reverse of the first conductivity type thin film transistor in conductivity type.

According to another aspect of the present invention, there is provided a method for fabricating an active-matrix liquid crystal display integrally formed with a driver circuit wherein a liquid crystal material is sandwiched between a TFT substrate and a counterpart substrate having a counter electrode on an insulating substrate, the TFT substrate comprising an insulating substrate, thin film transistors arranged in a matrix pattern on the insulating substrate and each provided to an individual pixel portion for use as a switching element, and a CMOS driver circuit having a CMOS for driving the thin film transistor of each pixel portion, the method comprising formation of the thin film transistor of each pixel portion and the CMOS including a first conductivity type thin film transistor and a second conductivity type thin film transistor, the formation comprising at least the steps of:

(a) sequentially forming a channel semiconductor film, a gate insulating film and a gate electrode thin film on the insulating substrate in regions thereof provided for the thin film transistor of each pixel portion and for the first conductivity type thin film transistor and second conductivity type thin film transistor of the CMOS driver circuit, followed by forming a photoresist on the gate electrode thin film for finely patterning the gate electrode thin film;

(b) etching an electrode thin film with use of the photoresist as a mask to form gate electrodes each narrower than the photoresist;

(c) ion-implanting a first conductivity type impurity to a high concentration into source/drain regions lying on both sides of each of the gate electrodes with use of the photoresist as a mask to form three kinds of first conductivity type thin film transistors of an offset structure and afterword removing the photoresist; and (d) covering at least the thin film transistor of each pixel portion and the thin film transistor intended for the first conductivity type thin film transistor of the CMOS driver circuit with a photoresist and ion-implanting a second conductivity type impurity into the thin film transistor intended for the second conductivity type thin film transistor of the CMOS driver circuit to a concentration higher than the concentration of the first conductivity type impurity in terms of an effective concentration determined in view of the activation yield of each impurity at the time of completion of the activation thereof, to form the second conductivity type thin film transistor of the CMOS driver circuit.

Instead of the step (d), the method of the present invention may include the steps of:

(e) ion-implanting the first conductivity type impurity to the three kinds of thin film transistors to a low concentration thereby making all the three kinds of thin film transistors have a first conductivity type LDD structure; and (f) covering at least the regions provided for the thin film transistor of each pixel portion and the thin film transistor intended f or the first conductivity type thin film transistor of the CMOS circuit with a photoresist and ion-implanting the second conductivity type impurity into the thin film transistor intended for the second conductivity type thin film transistor of the CMOS driver circuit to a concentration higher than the concentration of the first conductivity type impurity in terms of an effective concentration determined in view of the activation yield of each impurity at the time of completion of the activation thereof, to form the second conductivity type thin film transistor of the CMOS driver circuit.

This method allows the thin film transistor of each pixel portion and the first conductivity type thin film transistor of the CMOS driver circuit to have an LDD structure instead of the offset structure. By virtue of the LDD structure the ON current can be increased while restricting the OFF current compared to the ON current in the case of the offset structure.

Alternatively, a method according to the present invention comprises formation of a thin film transistor of each pixel portion and first conductivity type thin film transistor and second conductivity type thin film transistor of a CMOS driver circuit, the formation comprising at least the steps of:

(g) sequentially forming a semiconductor film and a gate insulating film on an insulating substrate, followed by forming a gate electrode thin film over the entire substrate surface (h) masking with a photoresist a region provided for the second conductivity type thin film transistor of the CMOS driver circuit and regions provided for respective gate electrodes of the first conductivity type thin film transistor of the CMOS driver circuit and first conductivity type thin film transistor of each pixel portion, followed by patterning the gate electrode thin film by isotropic etching, thereby forming the gate electrodes, each of which is narrower than the photoresist masking the same;

(i) ion-implanting a first conductivity impurity type impurity into the semiconductor film in regions provided for the first conductivity type thin film transistor of the CMOS driver circuit and the first conductivity type thin film transistor of each pixel portion with use of the photoresist as a mask to form source/drain regions in each of those regions, the source/drain regions defining an offset channel therebetween;

(j) removing the photoresist;

(k) masking with a photoresist the regions provided for the first conductivity type thin film transistor of the CMOS driver circuit and the first conductivity type thin film transistor of each pixel portion and patterning the gate electrode thin film in the region provided for the second conductivity type thin film transistor of the CMOS driver circuit to form the gate electrode of the second conductivity type thin film transistor; and (l) ion-implanting a second conductivity type impurity into the semiconductor film in the region provided for the second conductivity type thin film transistor of the CMOS driver circuit with use of the photoresist as a mask to form source/drain regions of the second conductivity type thin film transistor.

With this method, it is possible to reduce the amount of the second conductivity type impurity ion to be implanted into the region provided for the second conductivity type thin film transistor at step (1). This will contribute to a higher throughput.

This method may additionally include, between the steps (j) and (k), the step (m) of ion-implanting the first conductivity type impurity into the regions provided for the first conductivity type thin film transistor of the CMOS driver circuit and for the first conductivity type thin film transistor of each pixel portion with use of the gate electrodes as a mask to a concentration lower than the concentration of the first conductivity type impurity resulting from the preceding ion implantation.

With this additional step (m), the LDD structure can be easily realized advantageously.

Preferably, the channel semiconductor film in at least one of the regions provided for the first conductivity type thin film transistor and second conductivity type thin film transistor of the CMOS driver circuit is lightly doped with an impurity element of the conductivity type opposite to the conductivity type of the source/drain regions of the corresponding transistor. This advantageously permits the threshold voltage of the transistor to be controlled.

It is preferred that the channel semiconductor film in the regions provided for the thin film transistor of each pixel portion and the first conductivity type thin film transistor of the CMOS driver circuit be lightly doped with the second conductivity type impurity. This allows the threshold voltage of these transistors to be controlled.

The ion implantion of the second conductivity type impurity to the region provided for the second conductivity type thin film transistor is preferably achieved by an oblique implantation process which implants ions of the second conductivity type impurity at an angle of incidence of 20° or larger. This allows the transistor to have an decreased "OFF current".

Further, when the gate electrode thin film is formed of polysilicon previously doped with the first conductivity type impurity, an additional step is preferably performed to ion-implating the first conductivity type impurity to the gate electrode thin film in the region provided for the second conductivity type thin film transistor of the CMOS driver circuit after the formation of the gate electrode thin film to a concentration higher than the concentration of the second conductivity type impurity to be ion-implanted thereto later.

In the AMLCD of the present invention, the TFT of each pixel and the TFT of the same conductivity type as the TFT of each pixel are of offset or LDD structure. This arrangement permits the TFT of each pixel to have an "OFF current" lowered to not higher than about $10^{-11}$ A while enabling the CMOS driver circuit to use a high power source voltage, thereby realizing a high speed operation.

In the AMLCD fabrication method of the present invention, the TFT of each pixel and the TFT of the same conductivity type as the TFT of each pixel are fabricated in the same process. This makes it possible to reduce the number of times of photolithographic steps and that of ion implantation steps by one time and one time, respectively, compared to the conventional fabrication method. Further, certain examples of the method are able to reduce the number of times of etching steps by one time, compared to the conventional fabrication method.

Various other objects, features and attendant advantages of the present invention will be more fully appreciated as the same becomes better understood from the following detailed description when considered in connection with the accompanying drawings.

BRIEF DESCRIPTION OF THE DRAWINGS

FIG. 6 is a graphic representation showing the relationship between the field effect mobility ($\mu$) and the offset length before and after a hydrogenation treatment;

FIGS. 11(a) to 11(g) illustrate a conventional fabrication process for TFT section of an AMLCD.

DETAILED DESCRIPTION

Figure 1A:
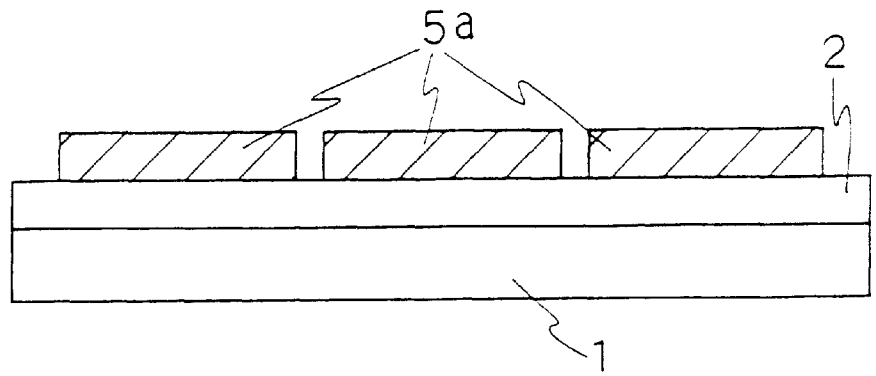
FIGS. 1(a) to 1(f) illustrate a fabrication process for TFT section of an AMLCD according to Example 1 of the present invention.
Figure 1B:
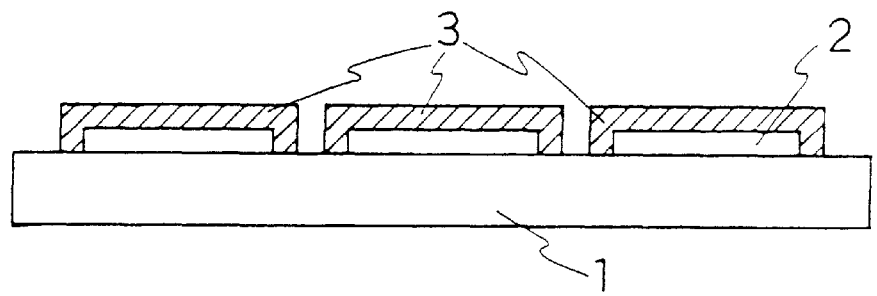

The present invention will now be described in detail with reference to the drawings.

Typically, an AMLCD includes a pair of opposing substrates with a predetermined clearance therebetween which are bonded together at the peripheral edges thereof, a liquid crystal material introduced into the clearance, polarizers disposed on both sides of the pair of substrates, a back light and the like. One of the substrates is a TFT substrate including an insulating substrate made of a material such as glass, plastic or the like on which are provided at least TFTs of pixel portions (hereinafter referred to as "pixel switching TFTs") and pixel electrodes arranged in a matrix pattern, signal buses, such as source interconnection lines and gate interconnection lines, which are extending longitudinally and transversely in a matrix manner to interconnect the pixel portions, a CMOS driver circuit comprising CMOS driver TFTs, i.e., an n-type TFT and a p-type TFT for driving each pixel switching TFT, and an alignment film. The other substrate is a counter electrode substrate including an insulating substrate similar to the abovementioned, on which are provided at least a counter electrode and optionally an alignment film, a black mask, a color filter and the like as required.

The present invention provides an AMLCD comprising TFTs of improved structure respectively for each pixel and the CMOS driver circuit, and an improved fabrication method therefor. The AMLCD is characterized in that both the pixel switching TFT and the TFT of the CMOS driver circuit of the same conductivity type as the pixel switching the TFT have an offset or LDD structure. Further, the fabrication method of the present invention is characterized in that those TFTs are fabricated in the same process thereby reducing the number of photographic steps and that of etching steps.

The present invention is similar to the conventional art in the features other than pointed out above and, hence, only the TFT structure of the TFT substrate and the fabrication method therefor will be described by way of specific examples thereof.

EXAMPLE 1

FIGS. 1(a) to 1(f) illustrate one example of a fabrication process for a TFT section of an AMLCD according to the present invention. In these figures, the TFT section includes an insulating substrate 1, a polysilicon film 2 for use as a channel semiconductor film, a gate insulating film 3, an n$^+$-polysilicon 4 heavily doped with P and intended for gate electrodes, a photoresist 5 including 5a, 5b and 5c, source/drain regions 16, 26 and 36 implanted with P ion to a high concentration which are formed of, for example, n$^+$-polysilcon, and source/drain regions 37 implanted with B ion to a high concentration which are formed of, for example, p$^+$-polysilicon. Here, a switching element n-type TFT of the pixel portion and the n-type TFT of the CMOS driver circuit are of offset structure, while the p-type TFT of the CMOS driver circuit is not of offset structure but of conventional planar structure.

The semiconductor devices of the abovementioned structures are fabricated according to the following method. First, the polysilicon film 2 for use as a channel semiconductor film is formed on the insulative substrate 1 by, for example, low pressure CVD process, plasma CVD process or atmospheric pressure CVD, followed by forming the photoresist 5a (refer to FIG. 1(a)). Dry etching is then performed to define polysilicon islands. The polysilicon film may be formed by forming an amorphous silicon film using plasma CVD process, low pressure CVD process or atmospheric pressure CVD process and thereafter carrying out a solid phase crystallization at 550° C. or above, or by forming an amorphous or polysilicon film followed by carrying out a laser annealing process. Thereafter, the gate insulating film 3 is formed by thermal oxidation process, low pressure CVD process, atmospheric CVD process, ECR plasma CVD process, plasma CVD process or a like process, or by combining two or more of these processes (refer to FIG. 1(b)).

Figure 1C:
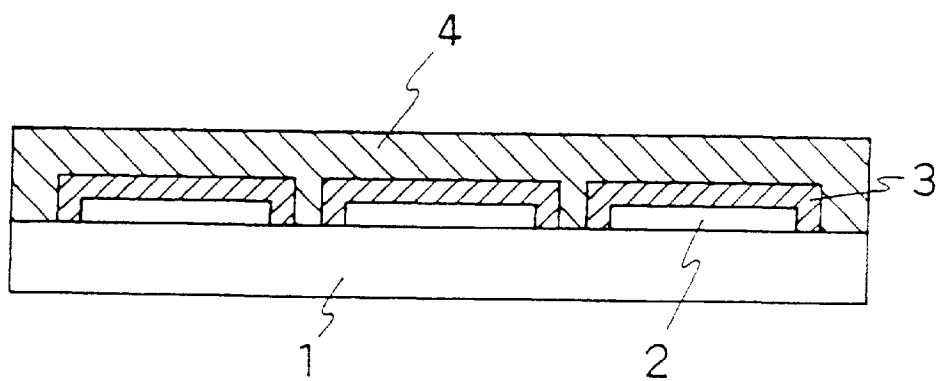

In turn, the gate electrode thin film 4, such as of n$^+$-polysilicon, intended for the gate electrodes is formed by, for example, a low pressure CVD process (refer to FIG. 1(c)).

Figure 1D:
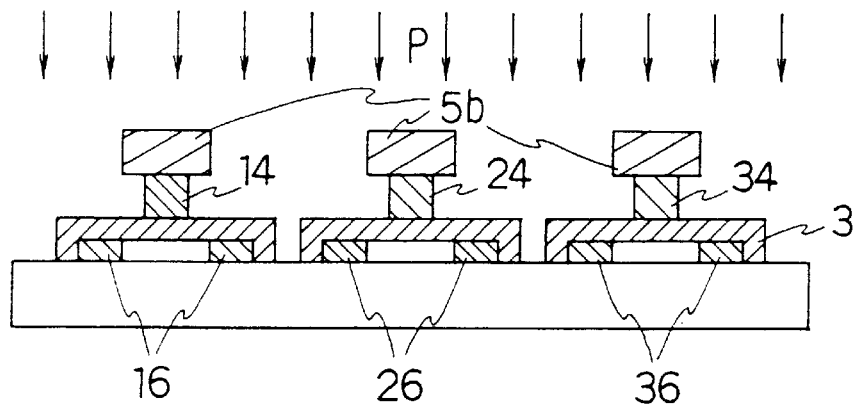

Subsequently, as shown in FIG. 1(d), to form the gate electrodes of each pixel switching TFT 10 and TFTs 20 and 30 of the CMOS driver circuit the photoresist 5b is formed and then the n$^+$-polysilicon thin film 4 is etched using, for example, SF$_6$ gas to form patterns of the gate electrodes 14, 24 and 34. At this time, the completion of the dry etching is judged by monitoring fluorine radicals having a spectrum of 704 nm, followed by overetching for a predetermined time period to side-etch the n$^+$-polysilicon thin film 4. This enables the width of each of the resulting gate electrodes 14, 24 and 34 to become narrower than the width of the photoresist pattern. As a result, the gate electrodes 14, 24 and 34 in combination with the photoresist thereon form projecting structures. Where the gate electrodes are formed of a metal, the projecting structures may be formed by overetching the metal in accordance with a wet etching process.

Thereafter, P ion is implanted into the polysilicon islands to a high concentration to form the source/drain regions 16, 26 and 36 of n$^+$-polysilicon film heavily doped with P.

Figure 1E:
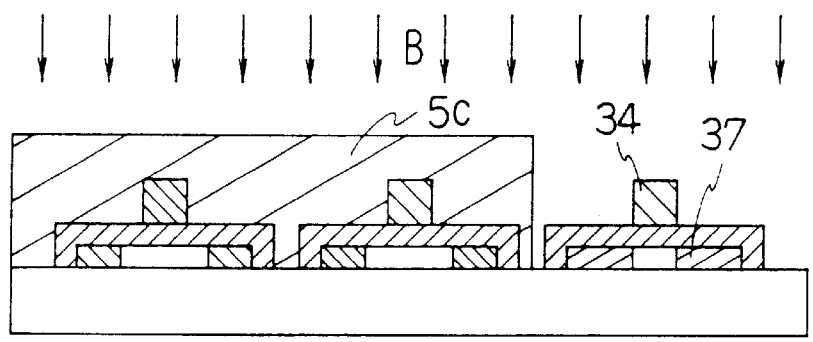
Figure 1F:
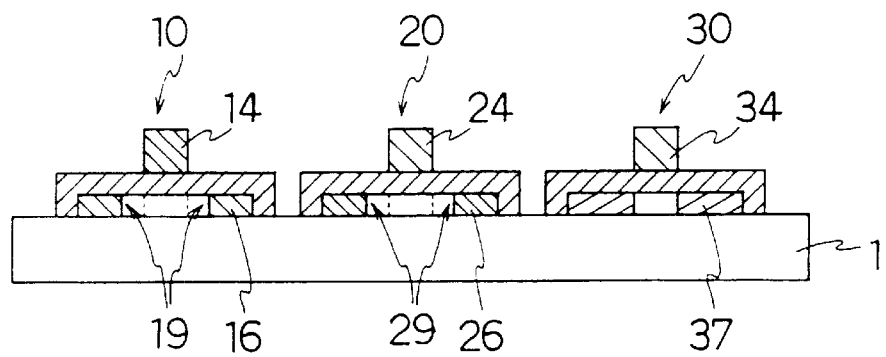

In turn, as shown in FIG. 1(e), the regions provided for each pixel switching TFT 10 and the n-type TFT 20 of the the CMOS driver circuit are covered with the photoresist 5c, and then the region provided for the p-type TFT 30 of the CMOS driver circuit is implanted with B ion thereby forming source/drain region 37 of p$^+$-polysilicon layer heavily doped with B. In this case, the amount of B to be ion-implanted is desired to be set so that the B concentration resulting from the ion implantation will exceed the concentration of P implanted at the step of FIG. 1(d) in terms of effective concentration determined in view of the activation yield of each impurity at the time of completion of activation thereof. The activation yield at the time of completion of activation herein is meant by the ratio of the amount of an impurity having released the carrier to the total amount of the impurity contained in the film. It is desirable that the semiconductor assume a desired conductivity type after the activation of the impurity.

Finally, the photoresist 5c is removed to complete the n-type offset TFT 10 for use as the switching element of each pixel and the n-type offset TFT 20 and p-type TFT 30 of the CMOS driver circuit. With this method, it is possible to fabricate these TFTs 10, 20 and 30 by carrying out dry etching step twice and photolithographic step three times.

Although the subject method employs the ion implantation to dope the silicon thin film with impurities, a diffusion process or a like technique may be employed instead of the ion implantation. Further, although P is used as the n-type impurity in this Example, arsenic (hereinafter referred to as "As") may be used instead.

Reference is then made to the operation of the semiconductor devices according to the present Example. In this case, the TFT 10 for use as the switching element of each pixel is of offset structure polysilicon. It is important that the pixel switching TFT 10 have a decreased "OFF current". Generally, the "OFF current" is desirably not higher than about $10^{-11}$ A. However, it is difficult to decrease the "OFF current" to such a value or lower since the TFT of polysilicon in the "OFF state" is affected by crystal defects present at grain boundary, so that field emission current flows in the drain region. For this reason, offset regions 19 and 29 are provided on both sides of the gate electrode as in the TFTs 10 and 20 shown in FIG. 1(f) to decrease the electric fields of the drain regions 16 and 26 thereby decreasing the "OFF current".

Since the n-type TFT 20 of the CMOS driver circuit region is of the offset structure, this offset region in the TFT 20 acts as a series resistor and, hence, the "ON current" may be decreased. This problem is solved by optimizing the offset length and the material characteristics of Si. The offset length can be precisely controlled by using the side etching technique against the n$^+$-polysilicon film forming the gate electrodes 14 and 24. In a TFT actually fabricated the offset length is about 0.2 μm to about 2.0 μm. To increase the "ON current" it is required to reduce the series resistance of the offset regions, or specifically, to improve the material characteristics of polysilicon. To this end, polysilicon is subjected to a hydrogenation treatment. FIG. 6 shows the offset length dependence of the "ON current" of an offset TFT before and after the hydrogenation treatment. As shown in FIG. 6, the hydrogenation treatment causes the drain current of the TFT to increase substantially. The hydrogenation treatment utilizes hydrogen plasma generated by the use of ECR (Electron Cyclotron Resonance) plasma so as to be achieved at a high efficiency. The hydrogenation treatment may be based on a typical parallel flat plate high frequency plasma CVD, hydrogen ion implantation, or a method of supplying hydrogen by forming an SiN$_x$ using a plasma CVD and annealing the SiN$_x$ film. Preferably, the polysilicon is heat-treated at a high temperature, for example, at least 700° C. after the formation thereof so as to perform further improved material characteristics thereof, thereby improving the "ON characteristic" of the TFT. Where the thermal oxidation process is used for the formation of the gate insulating film, the heat treatment for improving the material characteristics of the polysilicon may be performed at the same time therewith. In this case, the temperature for heat treatment is desirably at least about 900° C. .

At the step shown in FIG. 1(e), the source/drain regions 37 comprising p$^+$-polysilicon formed by B ion implantation are formed to construct the p-type TFT 30 of the CMOS driver circuit. In this B ion implantation, the n$^+$-polysilicon film 34 serving as the gate electrode of the p-type TFT 30 of the CMOS driver circuit is also implanted with B. Accordingly, P contained in the gate electrode is compensated by B, so that the concentration of effective carrier in the film decreases and the resistance of the gate electrode increases. Further, if the B concentration exceeds the P concentration, the conductivity type of the gate electrode turns into p-type. This results in a problem of a substantially increased threshold voltage Vth of the TFT. For this reason, the process needs to be controlled so that the P concentration of the gate electrode will at least be higher than the concentration of B implanted into the gate electrode film in terms of effective concentration of each impurity determined in view of the activation yield thereof after the completion of activation.

EXAMPLE 2

In Example 1, as shown in FIG. 1(e), the source/drain regions 37 comprising p$^+$-polysilicon formed by B ion implantation are formed to construct the p-type TFT 30 of the CMOS driver circuit. In this B ion implantation, the n$^+$-polysilicon film 34 serving as the gate electrode of the p-type TFT 30 of the CMOS driver circuit is also implanted with B. Accordingly, P contained in the gate electrode is compensated by B, so that the concentration of effective carrier in the film decreases and the resistance of the gate electrode increases. Further, if the B concentration exceeds the P concentration, the conductivity type of the gate electrode turns into p-type. This results in a problem of a substantially increased threshold voltage Vth of the TFT.

Figure 2:
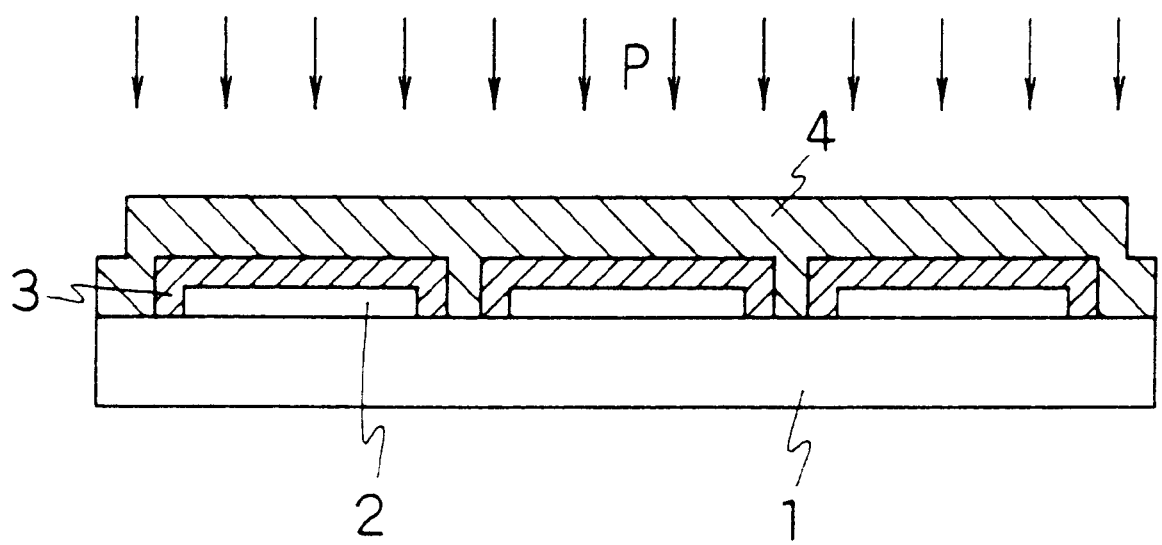
FIG. 2 illustrates one step of a fabrication process for TFT section of an AMLCD according to Example 2 of the present invention.

In this Example, after the formation of the n$^+$-polysilicon film for gate electrode at the step of FIG. 1(c) P ion is implanted into the n$^+$-polysilicon as shown in FIG. 2. The concentration of P implanted at this time is set to satisfy the relation: (P concentration in the gate electrode+concentration of P to be implanted)>(concentration of B to be implanted at the step of FIG. 1(e)). This prevents the effective carrier concentration from decreasing due to the fact that the P concentration of the n$^+$-polysilicon film of the gate electrode is compensated by B implanted at the step of FIG. 1(e).

This Example does not need to set the P concentration of the gate electrode in excess in view of the amount of P to be compensated by B.

In this Example, As may be used as the n-type impurity instead of P.

EXAMPLE 3

A third example of the method for fabricating the TFT section of an AMLCD according to the present invention will be described with reference to FIGS. 1(a) to 1(d) and FIGS. 3(a) to 3(c).

Figure 3A:
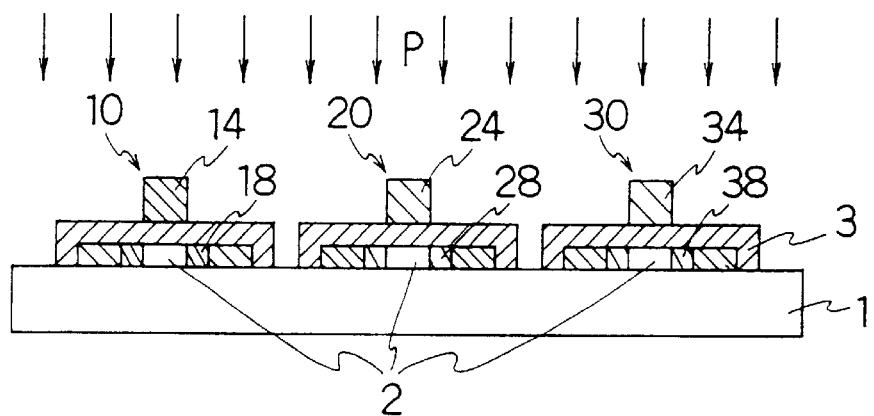
FIGS. 3(a) to 3(c) illustrate a fabrication process for TFT section of an AMLCD according to Example 3 of the present invention.
Figure 3B:
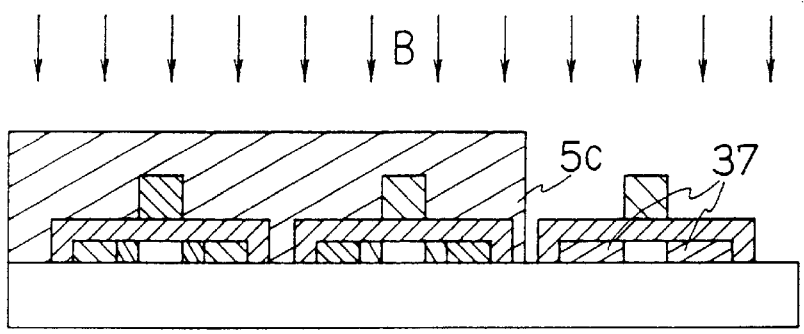
Figure 3C:
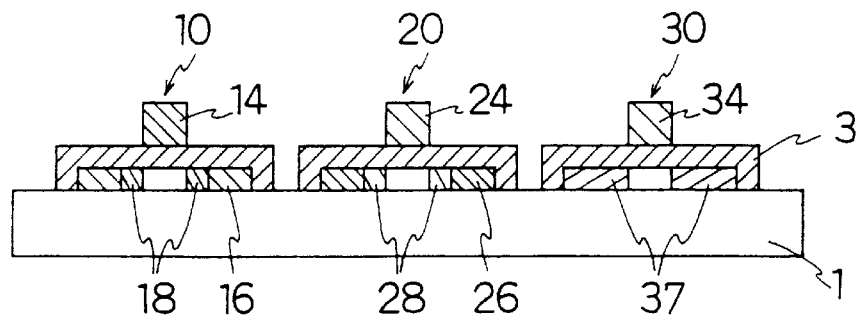

In FIGS. 3(a) to 3(c), numerals 18, 28 and 38 denote LDD regions comprising n$^+$-polysilicon, and other same numerals denote same parts of FIGS. 1(a) to 1(f). Here, each pixel switching n-type TFT 10 and the n-type TFT 20 of the CMOS driver circuit are of LDD structure, while the p-type TFT 30 of the CMOS driver circuit is not of the LDD structure but of the typical planar structure.

The fabrication method for the TFT section of the AMLCD according to this example is as follows:

First, in the same manner as in Example 1, on insulating substrate 1 are sequentially formed islands of channel semiconductor layer 2, gate insulatig film 3 and gate electrodes 4, followed by implantation of P ion using photoresist 5b of projecting structure as a mask thereby forming source/drain regions 16, 26 and 36 of n$^+$-polysilicon heavily doped with P, as shown in FIGS. 1(a) to 1(d).

After removal of the photoresist 5b, P ion is implanted to a low concentration, for example, about 1×10$^{16}$ cm$^{-3}$ to about 1×10$^{19}$ cm$^{-3}$ to form LDD regions 18, 28 and 38, as shown in FIG. 3(a). In this case, the dose of P ion is about 1×10$^{11}$ cm$^{-2}$ to about 1×10$^{14}$ cm$^{-2}$.

In turn, as shown in FIG. 3(b), the pixel switching TFT 10 and the n-type TFT 20 of the CMOS driver circuit being covered with photoresist 5c, the region for the p-type TFT 30 of the CMOS driver circuit is implanted with B ion to form source/drain regions 37 of p$^+$-polysilicon layer heavily doped with B in the p-type TFT region of the CMOS driver circuit. In this case it is desirable to set the amount of B to be implanted to exceed the amount of P having been ion-implanted at the step of FIG. 1(d).

Finally, by separation or exfoliation of the photoresist 5c the pixel switching n-type TFT 10 of LDD structure and the n-type TFT 20 of the CMOS driver circuit of LDD structure and the p-type TFT 30 of the CMOS driver circuit are completed.

Although the ion implantation technique is employed to dope the Si thin film with an impurity, the diffusion technique or a like technique may be employed instead.

Further, As may be used as the n-type impurity instead of P. The step shown in FIG. 3(a) may be interchanged with the other step shown in FIG. 3(b).

The basic operation of the TFT section of this example is similar to that described in Example 1.

In the present Example, the LDD regions 18 and 28 are formed on opposite sides of respective gate electrodes 14 and 24 of the pixel switching TFT 10 and the n-type TFT 20 of the CMOS driver circuit. The resistance of the LDD regions when TFTs are in the "ON state" is lower than that of the offset regions and, hence, the "ON current" is further improved. This results in the CMOS circuit offering an improved driving frequency.

EXAMPLE 4

Figure 4A:
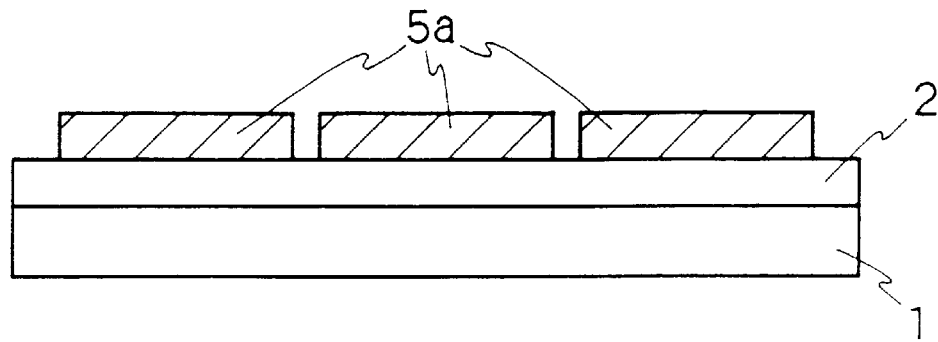
FIGS. 4(a) to 4(h) illustrate a fabrication process for TFT section of an AMLCD according to Example 4 of the present invention.
Figure 4B:
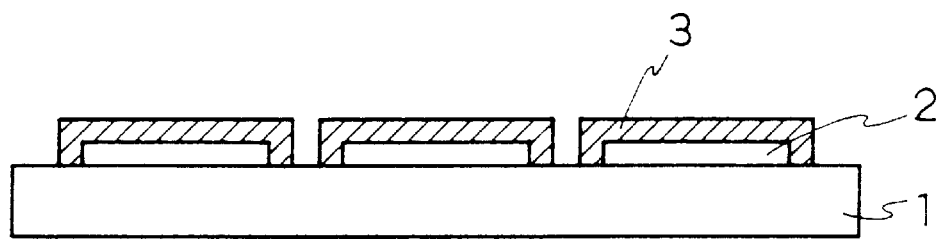
Figure 4C:
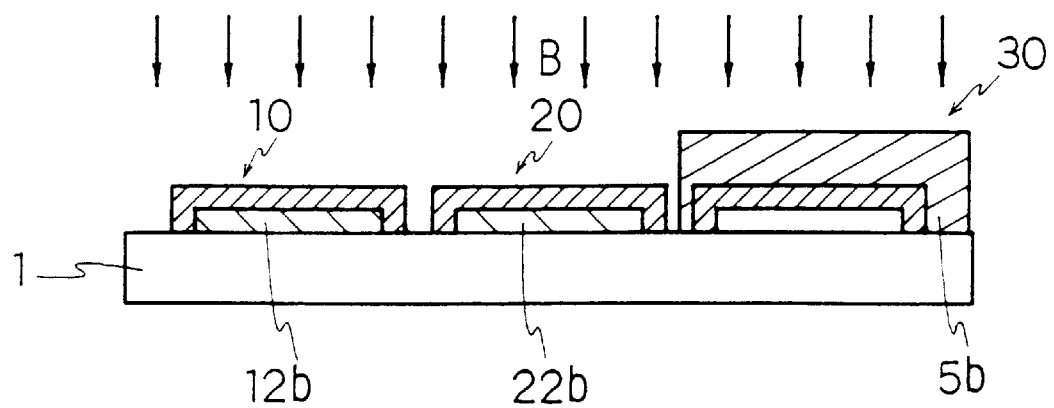

A fourth example of the present invention will be described with reference to FIGS. 4(a) to 4(h). In FIG. 4(c), numerals 12b and 22b denote a semiconductor film made of a material such as p$^-$-polysilicon for use as a channel lightly doped with B, and other same numerals denote like parts of Examples 1 and 3. Here, the pixel switching n-type TFT 10 and the n-type TFT 20 of the CMOS driver circuit are of the LDD structure, while the p-type TFT 30 of the CMOS driver circuit is not of the LDD structure but of the typical planar structure.

The TFT section of the structure shown is fabricated according to the following method. In the same manner as in Example 1, a channel semiconductor film 2 made of a material such as polysilicon film is formed on an insulating substrate 1 by, for example, low pressure CVD process, followed by forming a photoresist 5a. Dry etching is then performed to define polysilicon islands. The polysilicon film may be formed by forming an amorphous silicon film using plasma CVD process, low pressure CVD process or atmospheric pressure CVD process and thereafter carrying out solid phase crystallization at least 550° C., or by forming an amorphous silicon or polysilicon film followed by carrying out a laser annealing process. Thereafter, a gate insulating film 3 is formed by thermal oxidation process, low pressure CVD process, atmospheric CVD process or a like process (refer to FIGS. 4(a) and 4(b)). The procedure up to this step is the same as in Example 1.

In turn, the island region provided for the formation of the p-type TFT 30 of the CMOS driver circuit is covered with a photoresist 5b and then a p-type impurity such as B is ion-implanted to the regions provided for the formation of the pixel switching n-type TFT 10 and n-type TFT 20 of the CMOS driver circuit to adjust the threshold voltage (Vth) thereof. The dose of the p-type impurity has to be relatively small for light doping (refer to FIG. 4(c)). Ion implantation of B may be performed only to the region provided for the on-type TFT 20 of the CMOS driver circuit.

Another light doping step may be added so as to adjust the threshold voltage of the p-type TFT 30 of the CMOS driver circuit. In this case, the regions provided for the pixel switching n-type TFT 10 and n-type TFT 20 of the CMOS driver circuit are covered with photoresist to prevent a threshold adjust impurity atoms from being implanted to these TFTs.

Ion implantation of B for adjusting the threshold voltage Vth of the pixel switching n-type TFT 10 and n-type TFT 20 of the CMOS driver circuit may be performed prior to the formation of the gate insulating film 3 and after the formation of photoresist covering the p-type TFT region of the CMOS driver circuit. The gate insulating film 3 is formed using, solely or in combination, thermal oxidation process, low pressure CVD process, atmospheric pressure CVD process, ECR plasma CVD process or plasma CVD process after the removal of the photoresist.

Figure 4D:
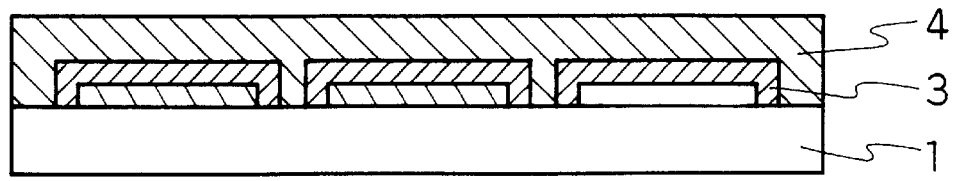

Subsequently, a gate electrode thin film 4 made of a material such as n$^+$-polysilicon is formed by, for example, low pressure CVD process (refer to FIG. 4(d)).

Figure 4E:
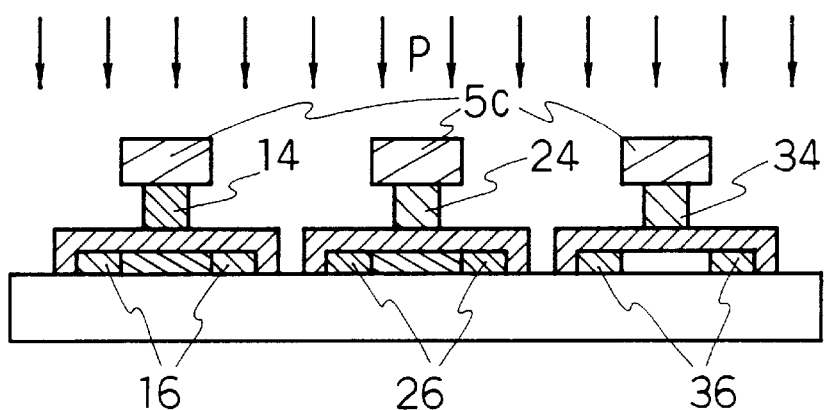

In turn, as shown in FIG. 4(e), to form the respective gate electrodes of pixel switching TFT 10 and TFTs 20 and 30 of the CMOS driver circuit a photoresist 5c is formed and then the n$^+$-polysilicon film is etched using, for example, SF$_6$ gas to form patterns of gate electrodes 14, 24 and 34. At this time, the completion of the dry etching against the n$^+$-polysilicon film is judged by monitoring fluorine radicals having a spectrum of 704 nm as in Example 1. Thereafter, over-etching is carried out for a predetermined time period to cause the n$^+$-polysilicon film to be side-etched, thereby forming an projection structure comprising each of the gate electrodes 14, 24 and 34 and the overlying photoresist. A metal may be used to form the gate electrodes, which is over-etched by, for example, wet etching to form the projection structure. Subsequently ion implantation of P is carried out to form source/drain regions 16, 26 and 36 comprising an n$^+$-polysilicon film.

Figure 4F:
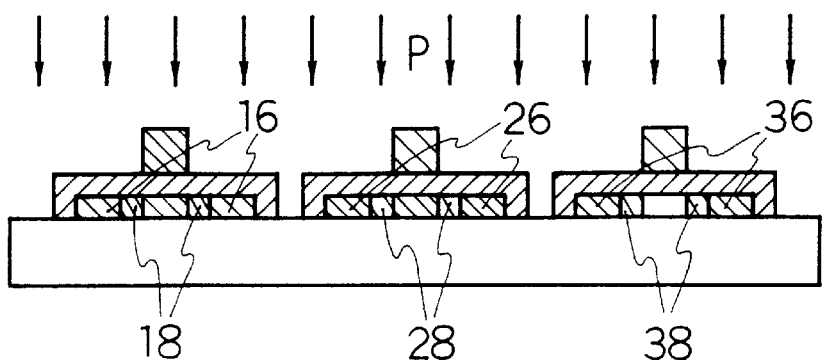

As shown in FIG. 4(f), after the exfoliation of the photoresist 5c, an n-type impurity such as P is ion-implanted to a low concentration (light doping) to form LDD regions 18, 28 and 38. The dose of ion in this ion implantation is about $1\times10^{11}$ cm$^{-2}$ to about $1\times10^{14}$ cm$^{-2}$ and is desirably set to have a concentration larger than the concentration of B lightly-implanted to the regions for the pixel switching TFT 10 and n-type TFT 20 of the CMOS driver circuit in terms of effective concentration determined in view of the activation yield of each impurity at the time of the completion of activation.

Figure 4G:
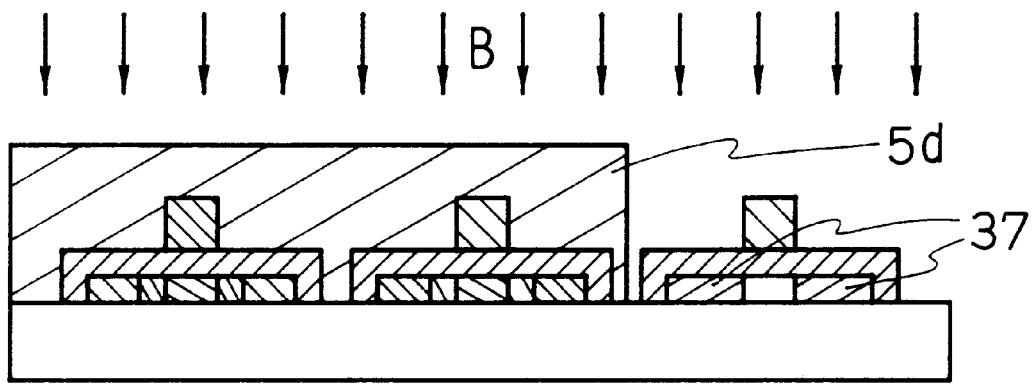
Figure 4H:
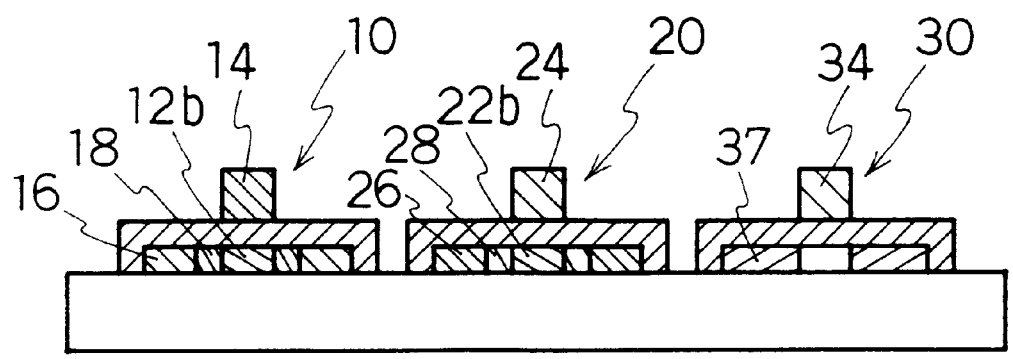

In turn, as shown in FIG. 4(g), the regions for the pixel switching TFT 10 and n-type TFT 20 of the CMOS driver circuit are covered with a photoresist 5d, and then ion implantation of B is carried out to form source/drain regions 37 comprising a p$^+$-polysilicon layer heavily doped with B in the region for the p-type TFT 30 of the CMOS driver circuit. In this case, the amount of B to be ion-implanted is desirably set to exceed that of P previously implanted at the step of FIG. 4(e) in terms of effective concentration determined in view of the activation yield of each impurity at the completion of activation.

Finally, the photoresist 5d is removed to complete the pixel switching n-type TFT 10 of LDD structure, n-type TFT 20 of the CMOS driver of LDD structure and p-type TFT 30 of the CMOS driver circuit.

Although ion implantation is used to dope Si thin film with an impurity in the above method, a diffusion technique may be used instead. Further, As may be used as the n-type impurity instead of P.

The basic operation of the TFT section in this Example is the same as described in Example 1. In this Example, the channel region of each of the pixel switching TFT 10 and n-type TFT 20 of the CMOS driver circuit is lightly doped with B. This allows the threshold voltage Vth of both TFTs 10 and 20 to be positively raised. For this reason, the drain current at the time when the gate voltage is 0 V decreases and, hence, the transfer characteristic of an inverter is improved particularly in the CMOS driver circuit. When the input voltage (Vin) is 0 V, a decrease in the output voltage (Vout) due to leak current of the n-type TFT can be avoided. Further, in addition to the light doping of the channel region, the LDD regions 18 and 28 are provided on the opposite sides of the respective gate electrodes of the TFTs 10 and 20. This allows the electric resistance of the TFTs in "ON state" to decrease rather than the TFTs of offset structure, thereby improving the "ON current" thereof. This results in an improvement in the drive frequency of the CMOS driver circuit.

EXAMPLE 5

Figure 5A:
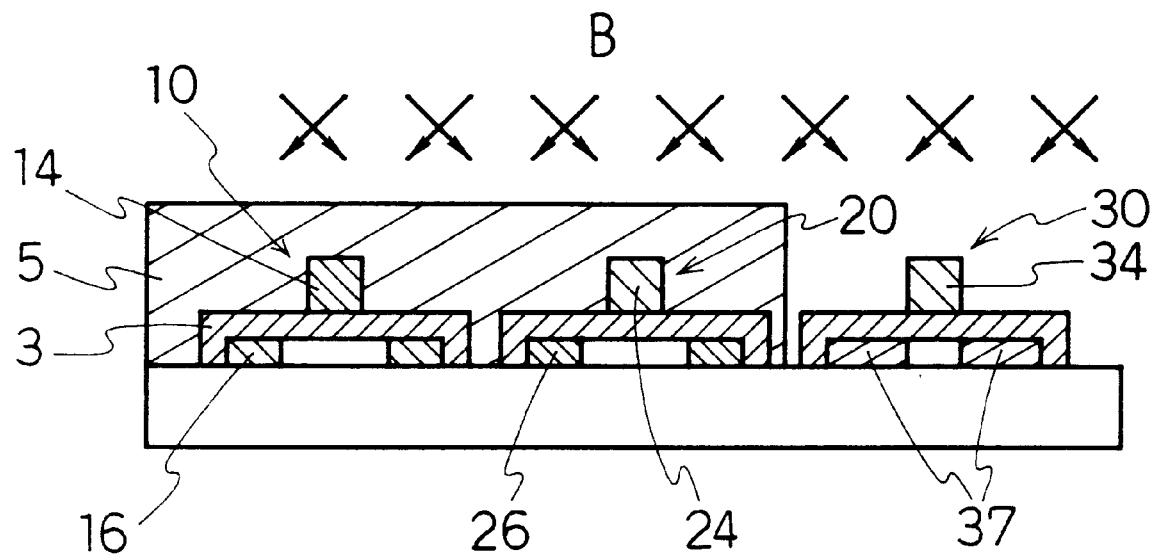
FIGS. 5(a) and 5(b) illustrate a fabrication process for TFT section of an AMLCD according to Example 5 of the present invention.
Figure 5B:
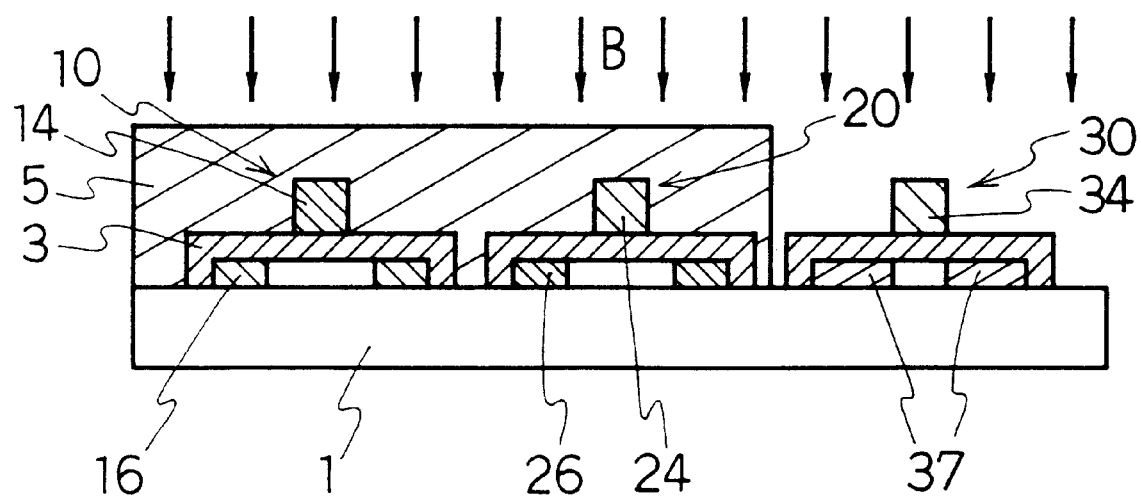

In Examples 1 to 4, ion implantation of B is carried out to form the p-type TFT of the CMOS -driver circuit. In this ion implantation, the so-called oblique implantation may be carried out for obliquely implanting B ion to a low concentration as shown in FIG. 5(a), followed by a usual ion implantation for a high concentration implant as shown in FIG. 5(b). Please not e that a process shown in FIG. 5(a) may be changed to a process shown in FIG. 5(b) with each other. In this oblique implantation, the angle of incidence of ion is slanted at least at 20a with respect to a line perpendicular to the surface of the substrate.

Such an ion implantation technique enables the formation of an overlap LDD structure under the corresponding gate electrode. Hence, it is possible to improve the withstand voltage of the p-type TFT 30 of the CMOS driver circuit against the drain voltage when the source/drain electrode 37 is applied with a voltage. Accordingly, the power source voltage for the CMOS circuit can further be improved, and this leads to an advantage of, for example, an improved output voltage of the inverter circuit.

EXAMPLE 6

In Examples 1 to 5, the pixel switching TFT comprises an n-type TFT of offset structure, but may comprise a p-type TFT instead. In the case of the pixel switching TFT comprising the p-type TFT, the fabrication method for the TFT section is basically the same as shown in FIGS. 1(a) to 5(b), associated with Examples 1 to 5. However, P has to be replaced with B and vice versa, for example, the P ion implantation is replaced with B ion implantation and vice versa. The description on the gate electrodes is not changed.

In the case of Example 4 (FIGS. 4(a) to 4(h)), the light doping of B for adjusting threshold voltage Vth at the step of FIG. 4(c) may be carried out with respect only to the region for the CMOS driver n-type TFT 20. In this case, B need not necessarily be replaced with P.

In this Example, the n-type impurity may comprise As instead of P.

EXAMPLE 7

In Example 1 to 6, the gate electrodes may comprise a $p^+$-polysilicon thin film instead of the $n^+$-polysilicon thin film. In this case too, other structural features are the same as in Examples 1 to 6.

EXAMPLE 8

In Examples 1 to 7, each TFT comprises a single gate TFT having one gate electrode, but it may comprise two or more TFTs connected in series so as to provide two or more gate electrodes between the source/drain regions. In this case too, other structrural features are the same as in Examples 1 to 7.

EXAMPLE 9

FIGS. 7(a) to 7(e) are sectional views for illustrating a process for fabricating a TFT array according to Example 9.

Figure 7A:
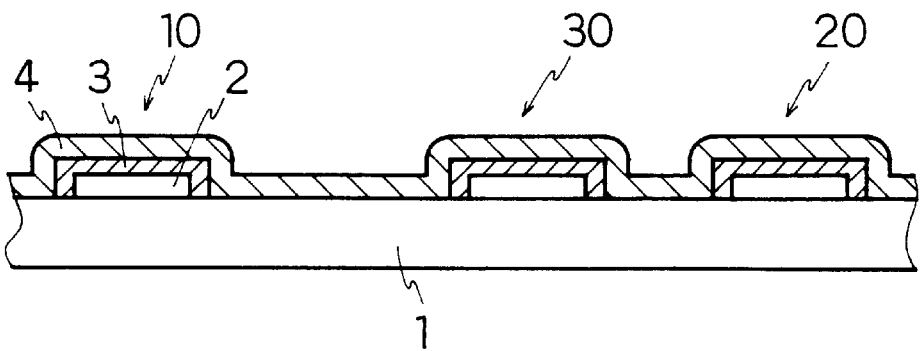
FIGS. 7(a) to 7(e) illustrate a fabrication process for TFT section of an AMLCD according to Example 9 of the present invention.

First, as shown in FIG. 7(a), a channel polysilicon film 2 for use as a channel layer is formed on an insulating substrate 1 such as made of quartz or glass using a low pressure CVD process. This channel polysilicon film 2 is patterned and then subjected to a thermal oxidation process to form a gate insulating film 3 of about 120 nm thickness. Further, a gate electrode thin film 4 of, for example, Si doped with P is formed over the. entire substrate surface. Here, the polysilicon film 2 may be formed by forming an Si film using a low pressure CVD and then crystallizing the same by solid phase epitaxy, laser annealing or a like process, or forming an Si film by a plasma CVD process and then crystallizing the same by solid phase epitaxy, laser annealing or a like process. The gate insulating film 3 may be formed by forming an $SiO_2$ film or the like by a sputtering process, a low pressure CVD process or an atmospheric pressure CVD process. These processes each may be used in combination with a thermal oxidation process. Further, the thin film to be used for gate electrode may be formed of an Si film doped with B or As, a metal thin film of aluminum, aluminum alloy or chromium, or a silicide thin film of molybdenum silicide, tungsten silicide or titanium silicide, as well as of the foregoing Si film doped with P.

Figure 7B:
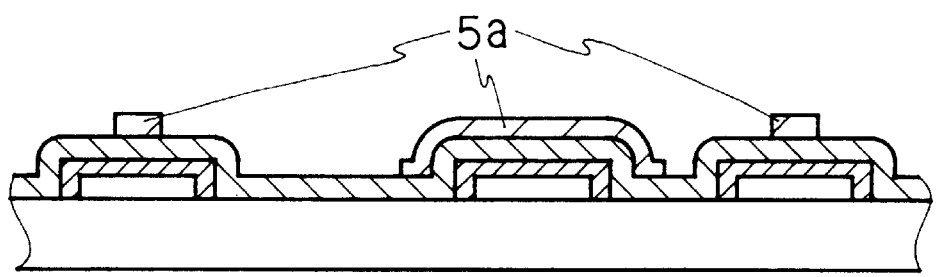

In turn, as shown in FIG. 7(b), a photoresist 5a is formed as covering the entire region for the p-type TFT 30 of the CMOS driver circuit and the gate electrode formation regions of the n-type TFT 20 of the CMOS driver circuit and pixel switching n-type TFT 10.

Figure 7C:
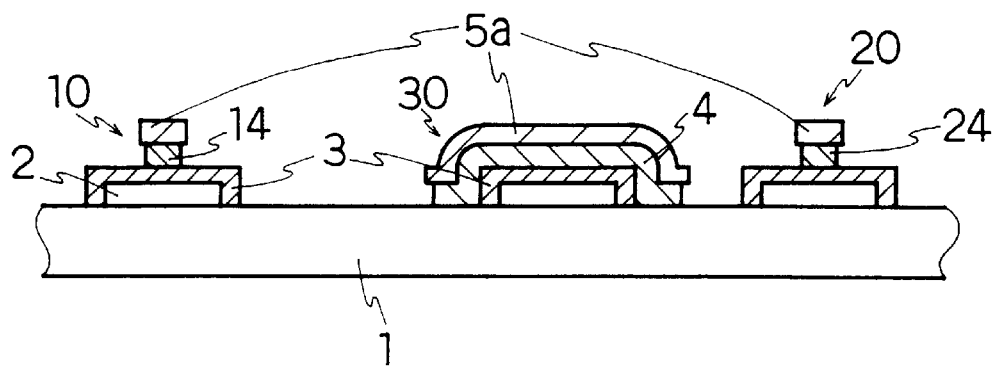

Subsequently, as shown in FIG. 7(c), using the photoresist 5a as a mask the gate electrode thin film 4, such as of Si, to be used as gate electrode is dry-etched using a gas mainly containing $SF_6$, $CF_4$, $NF_3$, $Cl_2$ or the like which is adapted for isotropic etching, thereby patterning the gate electrode thin film 4 as having a width smaller than the photoresist 5a by about 0.3 μm to about 2.0 μm.

Figure 7D:
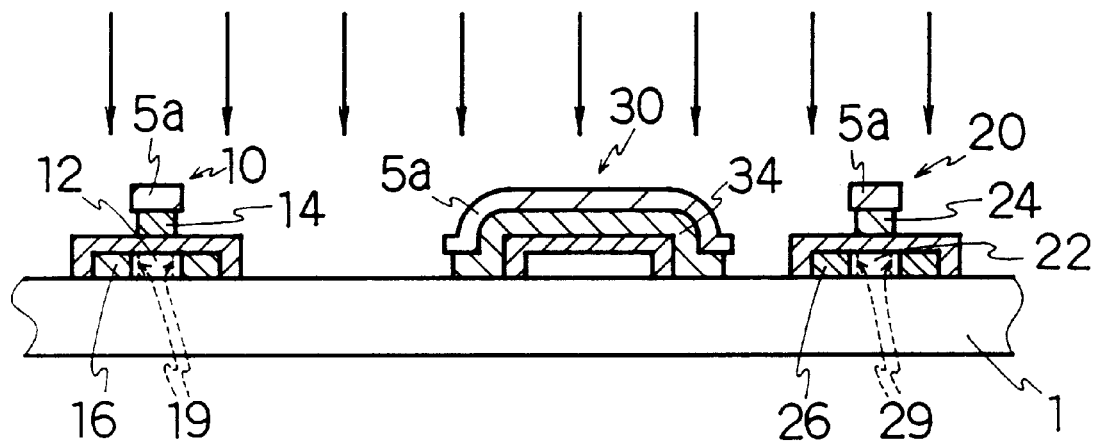

In turn, as shown in FIG. 7(d), an n-type impurity such as P or As is ion-implanted to the substrate surface with the photoresist 5a retained as it is, thereby forming n-type source/drain regions 16 and 26 respectively having offset regions 19 and 29 in the regions for the pixel switching n-type TFT 10 and n-type TFT 20 of the CMOS driver circuit. The length of the offset regions 19 and 29 is in the range of 0.3 μm to 2.0 μm, depending upon how much the the gate electrodes 14, 24 and 34 have been side-etched in the preceeding step. In this case the photoresist 5a on the gate electrodes 14 and 24 also serves to prevent the ion-implanted impurity from penetrating into the gate insulating film 3 and channel regions 12, 22 underlying the gate electrodes 14, 24 of the n-type TFTs 10, 20.

Figure 7E:
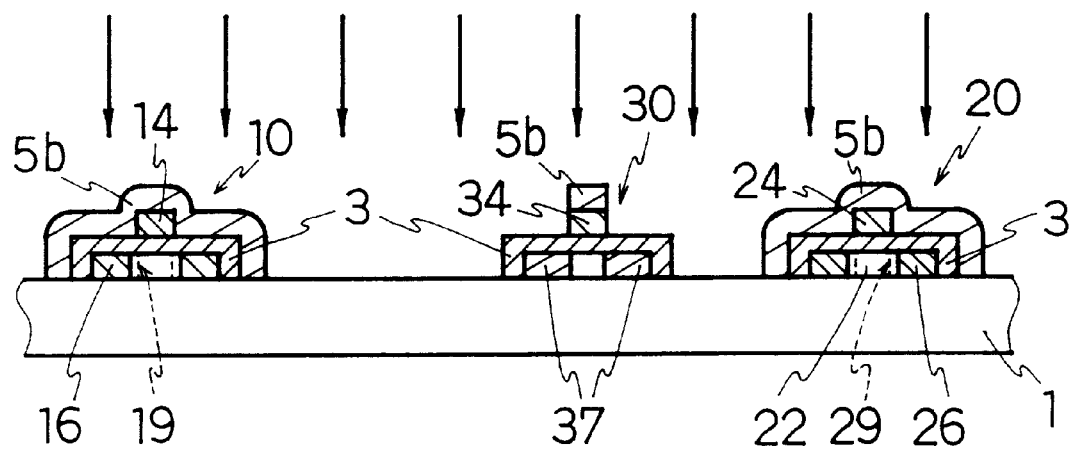

Finally, as shown in FIG. 7(e), after the removal of the photoresist 5a the n-type TFT 20 of the CMOS driver circuit and the pixel switching n-type TFT 10 are covered with a photoresist 5b, and then the gate electrode 34 of the p-type TFT 30 of the CMOS driver circuit is formed by patterning using the photoresist 5b, followed by ion implantation of a p-type impurity such as B with the photoresist 5b retained. This allows p-type source/drain regions 37 to be formed in p-type TFT region of the CMOS driver circuit. In this case too, the photoresist 5b on the gate electrode 34 also serves to prevent the ion-implanted impurity from penetrating into the gate electrode 34, underlying gate insulating film 3 and channel region of the p-type TFT 30. Here, the p-type TFT 30 is not of offset structure, but it may be of offset structure formed by isotropic etching.

The thus described TFT array fabrication method according to this Example enables a reduction in the number of steps required to form the pixel switching n-type TFT of offset structure and the TFTs of the CMOS driver circuit on the same substrate and hence realizes a reduction in the manufacturing cost and a high throughput. Further, offset structure of the n-type TFT of the CMOS driver circuit enables the CMOS driver TFTs to use a high source voltage. In this Example, unlike in Example 1, the region for the p-type TFT 30 is masked in ion-implanting the impurity to the n-type TFTs. This enables the amount of the impurity such as B to be implanted to the p-type TFT to be reduced thereby offering an advantage of realizing a high throughput.

EXAMPLE 10

Example 9 employs an n-type TFT as the pixel switching TFT. However, even if a p-type TFT is employed as the pixel switching TFT, the p-type TFT of the CMOS driver circuit and the pixel switching p-type TFT can be simultaneously formed as having offset structure. This also makes it possible to reduce the number of fabrication steps and to provide TFTs of the CMOS driver circuit capable of using a high power source voltage. The TFT array of this Example can be fabricated according to the fabrication method described in Example 9 except that the p-type impurity is ion-implanted in the first implantation process while the n-type impurity is ion-implanted in the second implantation process.

By masking the n-type TFT region in the ion implantation of the p-type impurity, it is possible to reduce the amount of the impurity such as B to be implanted to the p-type TFT region and to provide an advantage of realizing a high throughput.

EXAMPLE 11

While Example 9 employs the offset structure for the pixel switching n-type TFT 10 and n-type TFT 20 of the the CMOS driver circuit, the present Example employs the LDD structure therefor.

The fabrication method according to this Example is as follows. This fabrication method follows the method of Example 9 up to the step of ion implantation of the n-type impurity as shown in FIG. 7(d) to form n-type TFTs 10 and 20 of offset structure.

Figure 8A:
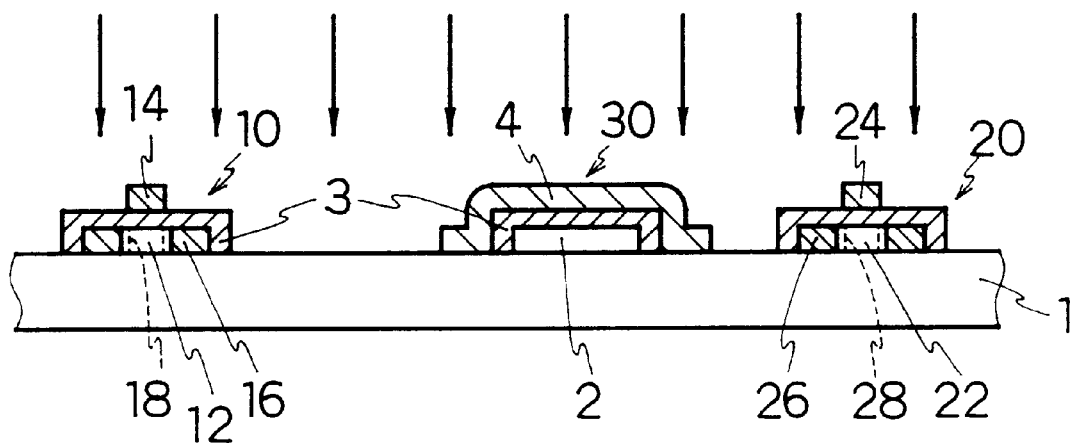
FIGS. 8(a) and 8(b) illustrate a fabrication process for TFT section of an AMLCD according to Example 11 of the present invention.

In turn, as shown in FIG. 8(a), after the removal of a photoresist 5a, an n-type impurity such as P or As is ion-implanted to a low concentration using gate electrodes 14 and 24 as a mask. In this implantation, the acceleration voltage is required to be set to prevent the n-type impurity from passing through the gate electrodes 14 and 24 and penetrating into the gate insulating film or the channel regions 12 and 22. Also, in the implantation an Si thin film 4 to be used as the gate electrode is retained in the region provided for the formation of the p-type TFT 30 of the CMOS driver circuit and serves as a mask thereby preventing the n-type impurity from penetrating into the Si portion to serve as a channel region.

Figure 8B:
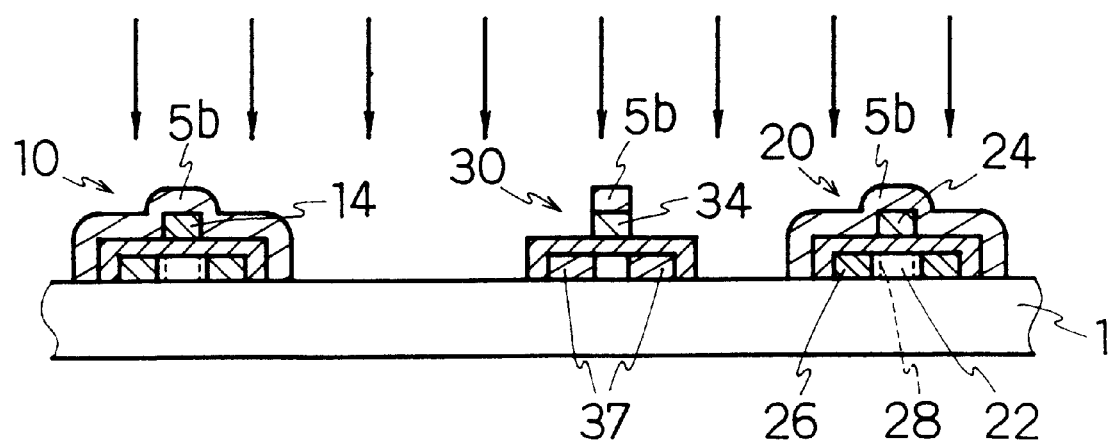

Finally, as shown in FIG. 8(b), the n-type TFT 20 of the CMOS driver circuit and the pixel switching n-type TFT 10 are covered with a photoresist 5b, followed by forming the gate electrode 34 of the p-type TFT 30 of the CMOS driver circuit by patterning using the photoresist 5b. Ion implantation of a p-type impurity such as B is then performed with the photoresist 5b retained as it is. This results in the formation of p-type source/drain regions 37 in the p-type TFT 30 of the CMOS driver circuit.

The thus described TFT array fabrication method according to this Example enables a reduction in the number of steps required to form the pixel switching n-type TFT of LDD structure and TFTs of the CMOS driver circuit on the same substrate and hence realizes a reduction in manufacturing cost and a high throughput. Further, the LDD structure of the n-type TFT of the CMOS driver circuit enables the TFTs of the CMOS driver circuit to use a high source voltage. The LDD structure employed in this Example allows the resistance of the TFTs in "ON state" to decrease rather than the TFTs of offset structure, thereby improving the "ON current" thereof. This results in an improvement in the drive frequency of the CMOS driver circuit. Further, in this Example, unlike in Example 3, the region for the p-type TFT 30 is covered with the Si thin film 34 in forming the n-type TFTs of LDD structure, thereby preventing the impurity such as P from penetrating into the p-type TFT region. This enables the amount of the impurity such as B to be implanted to the p-type TFT 30 to be reduced thereby offering an advantage of realizing a high throughput.

EXAMPLE 12

Example 11 employs an n-type TFT as the pixel switching TFT. However, even if a p-type TFT is employed as the pixel switching TFT, the p-type TFT of the CMOS driver circuit and the pixel switching TFT can be simultaneously formed as having LDD structure. This also makes it possible to reduce the number of fabrication steps required and to provide TFTs of the CMOS driver circuit capable of using a high power source voltage and a high drive frequency.

The TFT array of this Example can be fabricated according to the fabrication method described in Example 11 except that in the three ion implantation steps the p-type impurity is ion-implanted instead of the n-type impurity while the n-type impurity is ion-implanted instead of the p-type impurity.

The present Example provides the same effects as does Example 11.

EXAMPLE 13

Figure 9:
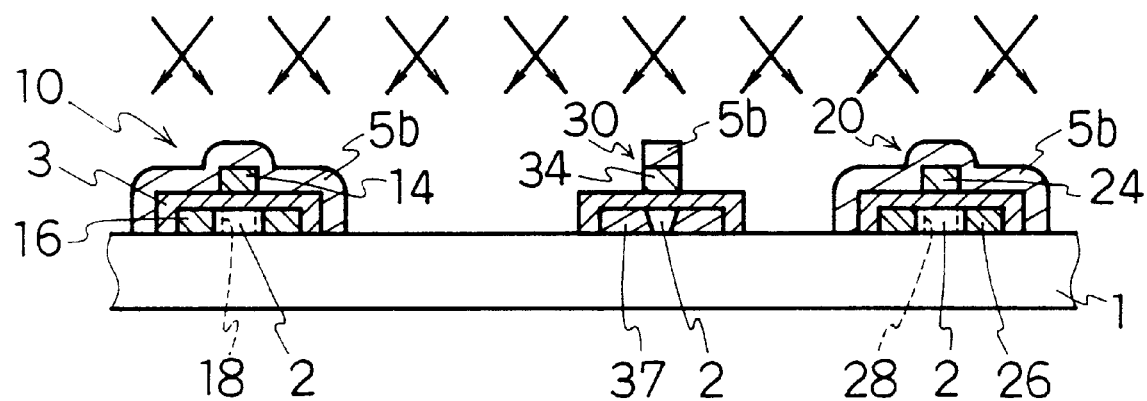
FIG. 9 illustrates a fabrication process for TFT section of an AMLCD according to Example 13 of the present invention.

In Examples 9 to 11, the p-type impurity such as B is vertically implanted to form the source/drain regions 37 of the p-type TFT of the CMOS driver circuit. Before or after this ion implantation, the oblique implantation may be carried out for obliquely implanting the p-type impurity as shown in FIG. 9. Such an ion implantation technique enables the formation of an overlap LDD structure under the corresponding gate electrode. Hence, it is possible to improve the withstand drain voltage of the p-type TFT 30 of the CMOS driver circuit when a voltage is applied across the source and drain electrodes thereof. Accordingly, the power source voltage for the driver circuit can further be increased, and this leads to an advantage of, for example, an enhanced output voltage of the inverter circuit.

EXAMPLE 14

Figure 10:
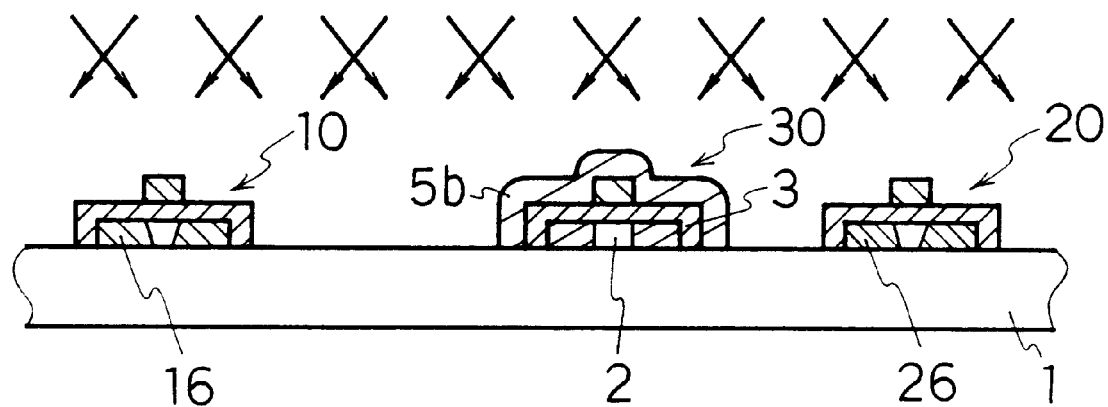
FIG. 10 illustrates a fabrication process for TFT section of an AMLCD according to Example 14 of the present invention.

In Examples 9 to 11, the n-type impurity such as P or As is vertically implanted to form the source/drain regions of the n-type TFT of the CMOS driver circuit. Before or after this ion implantation, the oblique implantation may be employed for obliquely implanting the p-type impurity as shown in FIG. 10.

Such an ion implantation technique enables the formation of an overlap LDD structure under the corresponding gate electrode. Hence, it is possible to improve the withstand drain voltage of the n-type TFT 20 of the CMOS driver circuit when a voltage is applied across the source and drain electrodes. Accordingly, the power source voltage for the driver circuit can further be increased, and this leads to an enhanced output voltage of, for example, the inverter circuit.

EXAMPLE 15

While Examples 9 to 14 do not employ channel doping, in the present Example the channel Si film in at least one of the n-type and p-type TFT regions of the CMOS driver circuit and is ion-implanted with an impurity of the conductivity type opposite to that of the source/drain regions thereof prior to the gate electrode formation. This makes it possible to adjust the threshold voltage of the TFT thereby improving the response characteristics of the CMOS driver TFTs.

As has been described, the AMLCD of the present invention employs an offset structure or LDD structure for one of the n- and p-type TFTs of the CMOS driver circuit. This allows the CMOS driver circuit to use a power source of high power source voltage, the output voltage of the driver circuit to be enhanced, and the operational range of the pixel switching TFT to be broadened. Thus, the AMLCD of the present invention exhibits high performance.

Further, the AMLCD fabrication method of the present invention applies the offset structure or LDD structure to one of the TFTs of the CMOS driver circuit which is of the same conductivity type as the pixel switching TFT and fabricates these two TFTs in common fabrication process. This makes it possible to reduce the number of times of photolithographic steps by one time and the number of times of ion implantation steps by one time, and further, in some aspects of the invention the number of times of etching steps can be reduced by one time. Thus, the method of the present invention enables the number of times of required fabrication steps to be reduced. As a result, the fabrication method of the present invention makes it possible to lower the production cost and improve the throughput and, hence, provides an inexpensive AMLCD.

While only certain presently preferred embodiments of the invention have been described in detail, as will be apparent with those familiar with the art, certain changes and modifications can be made without departing from the spirit and scope of the invention as defined by the following claims.

What is claimed is:

1. A method for fabricating an active-matrix liquid crystal display integrally formed with a driver circuit wherein a liquid crystal material is sandwiched between a TFT substrate and a counterpart substrate having a counter electrode on an insulating substrate, the TFT substrate comprising an insulative substrate, thin film transistors arranged in a matrix pattern on the insulating substrate and each provided to an individual pixel portion for use as a switching element, and a CMOS driver circuit having a CMOS for driving the thin film transistor of each pixel portion, the method comprising formation of the thin film transistors of each pixel portion and the CMOS including a first conductivity type thin film transistor and a second conductivity type thin film transistor, the formation comprising at least the steps of:

(a) sequentially forming a channel semiconductor film, a gate insulating film and a gate electrode thin film on the insulating substrate in regions thereof provided for the thin film transistor of each pixel portion and for the first conductivity type thin film transistor and second conductivity type thin film transistor of the CMOS driver circuit, followed by forming a photoresist on the gate electrode thin film for finely patterning the gate electrode thin film;

(b) etching the gate electrode thin film with use of the photoresist as a mask followed by over-etching with use of the same etchant after judging the completion of the gate thin film etching for predetermined time period to form gate electrodes each narrower than the photoresist;

(c) after the step of etching the gate electrode thin film, ion-implanting a first conductivity type impurity to a high concentration into source/drain regions lying on opposite sides of each of the gate electrodes with use of the photoresist as a mask to form three kinds of first conductivity type thin film transistors of an offset structure and afterward removing said photoresist; and (d) covering at least the thin film transistor of each pixel portioned the thin film transistor intended for the first conductivity type thin film transistor of the CMOS driver circuit with a photoresist and ion-implanting a second conductivity type impurity into the thin film transistor intended for the second conductivity type thin film transistor of the CMOS driver circuit to a concentration higher than the concentration of the first conductivity type impurity in terms of an effective concentration determined in view of the activation yield of each impurity at the time of completion of the activation thereof, to form the second conductivity type thin film transistor of the CMOS driver circuit.

2. The method of claim 1, wherein the channel semiconductor film in at least one of the regions provided for the first conductivity type thin film transistor and second conductivity type thin film transistor of the CMOS driver circuit is lightly doped with an impurity element of the conductivity type opposite to the conductivity type of the source/drain regions of the corresponding transistor.

3. The method of claim 2, wherein the ion implantation of the second conductivity type impurity to the region provided for the second conductivity type thin film transistor of the CMOS driver circuit at the step (d) is achieved by an oblique implantation process which implants ions of the second conductivity type impurity at an angle of incidence of 20° or larger.

4. The method of claim 1, wherein the channel semiconductor film of at least both of the thin film transistor of each pixel portion and the first conductivity type thin film transistor of the CMOS driver circuit is lightly doped with the second conductivity type impurity.

5. The method of claim 4 wherein the ion implantation of the second conductivity type impurity to the region provided for the second conductivity type thin film transistor of the CMOS driver circuit at the step (d) is achieved by an oblique implantation process which implants ions of the second conductivity type impurity at an angle of incidence of 20° or larger.

6. The method of claims 1, wherein the ion implantation of the second conductivity type impurity to the region provided for the second conductivity type thin film transistor of the CMOS driver circuit at the step (d) is achieved by an oblique implantation process which implants ions of the second conductivity type impurity at an angle of incidence of 20° or larger.

7. The method of claim 1, wherein said step of forming a gate electrode thin film in step (a) comprises forming the gate electrode thin film of a polysilicon film previously doped with the first conductivity type impurity, and said method further comprising, after the gate electrode thin film is formed, the step of additionally ion-implanting the first conductivity type impurity to the gate electrode thin film in the region provided for the second conductivity type thin film transistor of the CMOS driver circuit after the formation of the gate electrode thin film so as to satisfy the relation:

(concentration of the first conductivity type impurity previously contained in the gate electrode of the second conductivity type thin film transistor+concentration of the first conductivity type impurity to be ion-implanted in this additional ion implantation)>(concentration of the second conductivity type impurity to be ion-implanted at the step (d)).

8. A method for fabricating an active-matrix liquid crystal display integrally formed with a driver circuit wherein a liquid crystal material is sandwiched between a TFT substrate and a counterpart substrate having a counter electrode on an insulating substrate, the TFT substrate comprising an insulative substrate, thin film transistors arranged in a matrix pattern on the insulating substrate and each provided to an individual pixel portion for use as a switching element, and a CMOS driver circuit having a CMOS for driving the thin film transistor of each pixel portion, the method comprising formation of the thin film transistors of each pixel portion and the CMOS including a first conductivity type thin film transistor and a second conductivity type thin film transistor, the formation comprising at least the steps of:

(a) sequentially forming a channel semiconductor film, a gate insulating film and a gate electrode thin film on the insulating substrate in regions thereof provided for the thin film transistor of each pixel portion and for the first conductivity type thin film transistor and second conductivity type thin film transistor of the CMOS driver circuit, followed by forming a photoresist on the gate electrode thin film for finely patterning the gate electrode thin film;

(b) etching the gate electrode thin film with use of the photoresist as a mask to form gate electrodes each narrower than the photoresist;

(c) after the step of etching the gate electrode thin film, ion-implanting a first conductivity type impurity to a high concentration into source/drain regions lying on opposite sides of each of the gate electrodes with use of the photoresist as a mask to form three kinds of first conductivity type thin film transistors of an offset structure and afterward removing said photoresist; and (d) ion-implanting the first conductivity type impurity to the three kinds of thin film transistors to a low concentration thereby making all the three kinds of thin film transistors have a first conductivity type LDD structure; and (e) covering at least the regions provided for the thin film transistor of each pixel portion and the thin film transistor intended for the first conductivity type thin film transistor of the CMOS circuit with a photoresist and ion-implanting the second conductivity type impurity into the thin film transistor intended for the second conductivity type thin film transistor of the CMOS driver circuit to a concentration higher than the concentration of the first conductivity type impurity in terms of an effective concentration determined in view of the activation yield of each impurity at the time of completion of the activation thereof, to form the second conductivity type thin film transistor of the CMOS driver circuit.

9. The method of claim 8, wherein the channel semiconductor film in at least one of the regions provided for the first conductivity type thin film transistor and second conductivity type thin film transistor of the CMOS driver circuit is lightly doped with an impurity element of the conductivity type opposite to the conductivity type of the source/drain regions of the corresponding transistor.

10. The method of claim 9, wherein the ion implantation of the second conductivity type impurity to the region provided for the second conductivity type thin film transistor of the CMOS driver circuit at the step (f) is achieved by an oblique implantation process which implants ions of the second conductivity type impurity at an angle of incidence of 20° or larger.

11. The method of claim 8, wherein the channel semiconductor film of at least both of the thin film transistor of each pixel portion and the first conductivity type thin film transistor of the CMOS driver circuit is lightly doped with the second conductivity type impurity.

12. The method of claim 11, wherein the ion implantation of the second conductivity type impurity to the region provided for the second conductivity type thin film transistor of the CMOS driver circuit at the step (f) is achieved by an oblique implantation process which implants ions of the second conductivity type impurity at an angle of incidence of 20° or larger.

13. The method of claim 8, wherein the ion implantation of the second conductivity type impurity to the region provided for the second conductivity type thin film transistor of the CMOS driver circuit at the step (f) is achieved by an oblique implantation process which implants ions of the second conductivity type impurity at an angle of incidence of 20° or larger.

14. The method of claim 8, wherein said step of forming a gate electrode thin film in step (a) comprises forming the gate electrode thin film of a polysilicon film previously doped with the first conductivity type impurity, and said method further comprising, after the gate electrode thin film is formed, the step of additionally ion-implanting the first conductivity type impurity to the gate electrode thin film in the region provided for the second conductivity type thin film transistor of the CMOS driver circuit after the formation of the gate electrode thin film so as to satisfy the relation:

(concentration of the first conductivity type impurity previously contained in the gate electrode of the second conductivity type thin film transistor+concentration of the first conductivity type impurity to be ion-implanted in this additional ion implantation)>(concentration of the second conductivity type impurity to be ion-implanted at the step (f)).

15. A method for fabricating an active-matrix liquid crystal display integrally formed with a driver circuit wherein a liquid crystal material is sandwiched between a TFT substrate and a counterpart substrate having a counter electrode on an insulating substrate, the TFT substrate comprising an insulative substrate, thin film transistors arranged in a matrix pattern on the insulating substrate and each provided to an individual pixel portion for use as a switching element, and a CMOS driver circuit having a CMOS for driving the thin film transistor of each pixel portion, the method comprising formation of the thin film transistor of each pixel portion and first conductivity type thin film transistor and second conductivity type thin film transistor of the CMOS driver circuit, the formation comprising at least the steps of:

(a) sequentially forming a semiconductor film and a gate insulating film on an insulative substrate, followed by forming a gate electrode thin film over the entire substrate surface;

(b) masking with a photoresist a region provided for the second conductivity type thin film transistor of the CMOS driver circuit and regions provided for respective gate electrodes of the first conductivity type thin film transistor of the CMOS driver circuit and first conductivity type thin film transistor of each pixel portion, followed by patterning the gate electrode thin film by isotropic etching, thereby forming the gate electrodes, each of which is narrower than the photoresist masking the same;

(c) ion-implanting a first conductivity type impurity into the semiconductor film in regions provided for the first conductivity type thin film transistor of the CMOS driver circuit and the first conductivity type thin film transistor of each pixel portion with use of the photoresist as a mask to form source/drain regions in each of these regions, the source/drain regions defining an offset channel therebetween;

(d) removing the photoresist;

(e) masking with a photoresist the regions provided for the first conductivity type thin film transistor of the CMOS driver circuit and the first conductivity type thin film transistor of each pixel portion and patterning the gate electrode thin film in the region provided for the second conductivity type thin film transistor of the CMOS driver circuit to form the gate electrode of the second conductivity type thin film transistor; and (f) ion-implanting an impurity of the second conductivity type into the semiconductor film in the region provided for the second conductivity type thin film transistor of the CMOS driver circuit with use of the photoresist as a mask to form source/drain regions of the second conductivity type thin film transistor.

16. The method of claim 15 further comprising, between the steps (a) and (e), the step (g) of ion-implanting the first conductivity type impurity into the regions provided for the first conductivity type thin film transistor of the CMOS driver circuit and for the first conductivity type thin film transistor of each pixel portion with use of the gate electrodes as a mask to a concentration lower than the concentration of the first conductivity type impurity resulting from the preceding ion implantation.

17. The method of claim 15, wherein the channel semiconductor film in at least one of the regions provided for the first conductivity type thin film transistor and second conductivity type thin film transistor of the CMOS driver circuit is lightly doped with an impurity element of the conductivity type opposite to the conductivity type of the source/drain regions of the corresponding transistor.

18. The method of claim 15, wherein the channel semiconductor film of at least both of the thin film transistor of each pixel portion and the first conductivity type thin film transistor of the CMOS driver circuit is lightly doped with the second conductivity type impurity.

19. The method of claim 15, wherein the ion implantation of the second conductivity type impurity to the region provided for the second conductivity type thin film transistor of the CMOS driver circuit at the step (k) is achieved by an oblique implantation process which implants ions of the second conductivity type impurity at an angle of incidence of 20° or larger.

* * * * *